US012056799B2

(12) United States Patent
Savant et al.

(10) Patent No.: US 12,056,799 B2
(45) Date of Patent: Aug. 6, 2024

(54) CONVERTING IMAGES TO SKETCHES THAT ARE MODIFIABLE USING COMPUTER-AIDED DESIGN (CAD) SOFTWARE

(71) Applicant: Dassault Systemes SolidWorks Corporation, Waltham, MA (US)

(72) Inventors: Shrikant Savant, Shrewsbury, MA (US); Harsh Sureshbhai Khoont, Cambridge, MA (US); Zahra Karimi, Boston, MA (US); Jody Stiles, Northborough, MA (US); Chin-Loo Lama, Bolton, MA (US); Makarand Apte, Pune (IN)

(73) Assignee: Dassault Systemes SolidWorks Corporation, Waltham, MA (US)

( * ) Notice: Subject to any disclaimer, the term of this patent is extended or adjusted under 35 U.S.C. 154(b) by 0 days.

(21) Appl. No.: 17/731,284

(22) Filed: Apr. 28, 2022

(65) Prior Publication Data
US 2023/0351650 A1    Nov. 2, 2023

(51) Int. Cl.
*G06T 11/20* (2006.01)
*G06F 30/12* (2020.01)
*G06T 7/12* (2017.01)

(52) U.S. Cl.
CPC ............ *G06T 11/203* (2013.01); *G06F 30/12* (2020.01); *G06T 7/12* (2017.01); *G06T 2207/20084* (2013.01)

(58) Field of Classification Search
None
See application file for complete search history.

(56) References Cited

U.S. PATENT DOCUMENTS 6,233,351 B1 * 5/2001 Feeney ............... G06V 30/347
                                                345/522
8,326,039 B2 * 12/2012 Kishi ..................... G06V 10/46
                                                382/185

(Continued)

OTHER PUBLICATIONS

Satoshi Suzuki, Topological Structural Analysis of Digitized Binary Images by Border Following; Computer Vision, Graphics, and Image Processing N,32-46 (1985).

(Continued)

*Primary Examiner* — Jeffrey J Chow
(74) *Attorney, Agent, or Firm* — Sheehan Phinney Bass & Green PA

(57) ABSTRACT

A computer-implemented method includes receiving a digital representation of an image and generating CAD sketches from it. The number of surfaces in a CAD model depends upon the number entities at the sketch level. The method keeps the number of created sketch entities and constraints to a minimum. The method includes a scalable approach for a range of images. Each contour is represented by a sequence of points following a path corresponding to a boundary in the image. The method includes classifying each point in a particular one of the contours as a curve region or a corner region contour point, thereby segmenting the contour into plurality of curve regions separated by corner regions. The method includes optimally fitting a curve to each one of the curve regions to create the best possible representation of the curve region. Additionally, the refine algorithm automatically improves the fit wherever needed.

29 Claims, 27 Drawing Sheets

(56) References Cited

U.S. PATENT DOCUMENTS

| | | | |
|---|---|---|---|
| 2004/0081350 A1* | 4/2004 | Kitamura | G06T 7/12 |
| | | | 382/149 |
| 2019/0261024 A1* | 8/2019 | Livshitz | G06T 3/4023 |
| 2019/0371008 A1 | 12/2019 | Peterson | |
| 2020/0210845 A1* | 7/2020 | Sanchez Bermudez | |
| | | | G06V 10/454 |
| 2020/0234473 A1* | 7/2020 | Yasuda | G06T 7/181 |
| 2021/0173966 A1* | 6/2021 | Li | G06F 30/10 |
| 2021/0357113 A1 | 11/2021 | Mangu et al. | |
| 2022/0114289 A1* | 4/2022 | Te | G06N 3/045 |
| 2022/0284609 A1* | 9/2022 | Shree | G06T 7/33 |
| 2023/0351650 A1* | 11/2023 | Savant | G06F 30/12 |

OTHER PUBLICATIONS

Fitzgibbon et al; A Buyer's Guide to Conic Fitting; BMVC 1995 doi:10.5244/C.9.51.

Open Source, Open CV Image Filtering: https://docs.opencv.org/4.x/d4/d86/group_imgproc_filter.html#gaabe8c836e97159a9193fb0b11ac52cf1, retrieved Nov. 14, 2023.

Open Source, Open CV Structural Analysis and Shape Descriptors; https://sheehan0-my.sharepoint.com/:x:/g/personal/dlemieux_sheehan_com/EQK2fiR8_jRBkfZxygFYYokBeNTHs6EHS9hgih4lpxj4fA?e=Tdu38s retrieved Nov. 14, 2023.

Open Source, Open CV Contours Hierarchy; https://docs.opencv.org/4.x/d9/d8b/tutorial_py_contours_hierarchy.html; retrieved Nov. 14, 2023.

Hoshyari Shayan Hoshyari@CS UBC CA et al: "Perception-driven semi-structured boundary vectorization", ACM Transactions on Graphics, ACM, NY, US, vol. 37, No. 4, Jul. 30, 2018 (Jul. 30, 2018), pp. 1-14.

Nguyen Thanh Phuong et al: "Decomposition of a Curve into Arcs and Line Segments Based on Dominant Point Detection", SAT 2015 18th International Conference, Austin, TX, USA, Sep. 24-27, 2015; [Lecture Notes in Computer Science; Lect.Notes Computer], Springer, Berlin, Heidelberg, pp. 794-805.

Chen Jen-Ming et al: "Segmentation of planar curves into circular arcs and line segments", Image and Vision Computing, vol. 14, No. 1, Feb. 1, 1996 (Feb. 1, 1996), pp. 71-83.

Extended European Search Report for EP23170454.5, dated Oct. 4, 2023.

* cited by examiner

Curve End Points

Corner and Tangency Points

Inflection Points (H) FITNESS METRIC

The Fitness Metric is defined as follows:

- During Curve Fitting
  - It measures the average deviation per point from the fitted curve
    - $$\text{Fitness Metric} = \frac{\sum_{i=0}^{N}|y_{Actual} - y_{Predicted}|}{N}, \text{ if slope} \leq 45°$$
    - $$\text{Fitness Metric} = \frac{\sum_{i=0}^{N}|x_{Actual} - x_{Predicted}|}{N}, \text{ if slope} \geq 45°$$

- During Refine
  - It measures the maximum deviation of any point from the corresponding point on the curve
    - $\text{Fitness Metric} = \max(|y_{Actual} - y_{Predicted}|)$ if slope $\leq 45°$
    - $\text{Fitness Metric} = \max(|x_{Actual} - x_{Predicted}|)$ if slope $\geq 45°$

FIG. 18

CONVERTING IMAGES TO SKETCHES THAT ARE MODIFIABLE USING COMPUTER-AIDED DESIGN (CAD) SOFTWARE

FIELD OF THE INVENTION

This disclosure relates to converting images to sketches and, more particularly, relates to a scalable computer-based approach to converting images to sketches.

BACKGROUND

Computer-aided design ("CAD") refers to the use of computers to aid in the creation, modification, analysis, or optimization of a design. Human CAD users often have old mechanical or hand drawings or photos of something that they need or want to reproduce or modify using CAD. Drawing the required sketches by hand into CAD can be quite time consuming and inefficient.

SUMMARY OF THE INVENTION

In one aspect, a computer-implemented method includes receiving a digital representation of an image, and generating contours based on the digital representation of the image. Each contour includes a sequence of points that follows a path that corresponds to a boundary in the image. The method includes classifying each contour point in a particular one of the contours as a curve region contour point or a corner region contour point, thereby segmenting the particular contour into plurality of curve regions separated from one another by corner regions. The curve regions are made up of curve region contour points only and the corner regions are made up of corner region contour points only. The method includes fitting a curve to each one of the curve regions.

Thus, in an exemplary implementation, the method includes classifying each contour point of every contour as a point that belongs to either a curve region or a corner region, thereby segmenting the contour into plurality of curve regions separated from one another by corner regions. In an exemplary implementation, a curve region is a region of the image that has its collection of points suitable for fitting an elemental curve. Moreover, in some implementations, two adjacent curve regions are separated from each other by a collection of points in a "corner region".

In another aspect, a computer system is disclosed that includes a computer processor and computer-based memory operatively coupled to the computer processor. The computer-based memory stores computer-readable instructions that, when executed by the computer processor, cause the computer-based system to receive a digital representation of an image, and generate contours based on the digital representation of the image. Each contour includes a sequence of points that follows a path that corresponds to a boundary in the image. The system further classifies each contour point in every contour as belonging to a "curve region" or a "corner region", thereby segmenting the entire contour into a plurality of curve regions separated from one another by corner regions. This classification is achieved by a unique application of the LSTM network (Long Short Term Memory network). The curve regions are made up of curve region contour points (i.e., contour points in a curve region) only and the corner regions are made up of corner region contour points (i.e., contour points in a corner region) only.

The system further fits a curve to each one of the curve regions with a computer-implemented curve finder.

In yet another aspect, a non-transitory computer readable medium (e.g., a computer memory storage device, disk, etc.) is disclosed that has stored thereon computer-readable instructions that, when executed by a computer-based processor, cause the computer-based processor to: receive a digital representation of an image, and generate contours based on the digital representation of the image. Each contour includes a sequence of points that follows a path that corresponds to a boundary in the image. The processor further classifies each contour point in every contour as belonging to a "curve region" or a "corner region", thereby segmenting the entire contour into a plurality of curve regions separated from one another by corner regions. The curve regions are made up of curve region contour points only and the corner regions are made up of corner region contour points only. The processor further fits a curve to each one of the curve regions with a computer-implemented curve finder.

In still another aspect, a computer-implemented method is disclosed that includes generating a contour, with a computer-implemented contour generator, based on a digital representation of an image. Each contour includes a sequence of points that follows a path that corresponds to a boundary in the image. The method includes classifying, with a computer-implemented contour point classifier, each point in the contour as a curve region contour point or a corner region contour point, thereby segmenting the contour into plurality of curve regions separated from one another by corner regions. The curve regions are made up of curve region contour points only and the corner regions are made up of corner region contour points only. The method includes fitting a curve to each one of the curve regions with a computer-implemented curve finder. The method further includes applying a refine algorithm, with a computer-implemented refiner, to adjust the fitted curves in response to a determination that a fitness metric for the fitted curve does not satisfy a predefined criteria for acceptability. The refine algorithm includes lowering a threshold for corner detection, and reclassifying, with the computer-implemented contour point classifier, each point in the contour as a curve region contour point or a corner region contour point using the lowered threshold for corner detection, thereby segmenting the contour into new curve regions and new corner regions.

In some implementations, one or more of the following advantages are present.

For example, in some implementations, the systems and techniques disclosed herein address a problem faced by human CAD users of how to accurately capture the shape of a real-world item of interest in CAD without either having to manually create all of the required entities or spend a significant amount of time cleaning up a conversion that has created superfluous and unusable geometry.

In some implementations, the systems and techniques disclosed herein are scalable and work on various kinds of images ranging from simple to highly complex. Most existing algorithms will either try to fit a canonical shape such as a rectangle, a circle, an ellipse, a polygon etc., through the entire image, thus overly simplifying the image or will create a large polyline shape which connects all the points in the image resulting in way too many lines that are impractical to use in a CAD environment.

In some implementations, the algorithm creates a sketch with as few sketch entities as possible or practical without losing accuracy of the image conversion. The number of sketch entities created using this algorithm typically is orders of magnitude fewer than the polyline approach mentioned above.

In some implementations, the curve generated for each curve region is carefully constructed to minimize fitting error over that region, thus providing the best possible curve for that curve region. This process is repeated over the entire image, thus creating a collection of optimally fitted curves that when put together represent the original image in the best possible way.

In some implementations, the intelligent refine method, discussed herein, automatically adjusts the curve regions and corner regions over an area (e.g., user-selected area) of the image so as to improve (e.g., reduce) the fitness error, which is tracked internally through the fitness metric, from one iteration to the next.

The user interface, in some implementations, gives the human user a lot of control over how the preview sketch entities are generated. This allows the human user to interactively edit these entities to his or her satisfaction before a final 2D sketch is generated.

Typically, creating these sketch entities manually would be a very painstaking process and fraught with plenty of user errors. Overall, the systems and techniques disclosed herein allow for much faster generation of two dimensional (2D) sketch geometry from a document containing an image of interest.

The systems and techniques disclosed herein, in some implementations, leverage various machine learning and artificial intelligence techniques to help a human CAD user conceptualize, design, and model a product.

In addition, once the systems and techniques disclosed herein have been used to convert an image to a sketch in a computer-based environment, that sketch (e.g., in CAD) may be used, with alone or with additional features added (e.g., by a CAD user), in a design for a real-world physical object to be produced by a manufacturer. In some implementations, the manufacturer would use the sketch, alone or in combination with additional features, to produce the real-world object through a series of real-world physical processes. The real-world object in this example would be or include a version of whatever was represented in the original image. The overall design and manufacturing process in this example would be significantly more efficient by relying on and utilizing an implementation of the systems and techniques for image-to-sketch conversion disclosed herein.

Other features and advantages will be apparent from the description and drawings, and from the claims.

BRIEF DESCRIPTION OF THE DRAWINGS

FIG. 18 shows an example of a fitness metric used during curve fitting and refine process.

Like reference characters refer to like elements.

DETAILED DESCRIPTION

Figure 1:
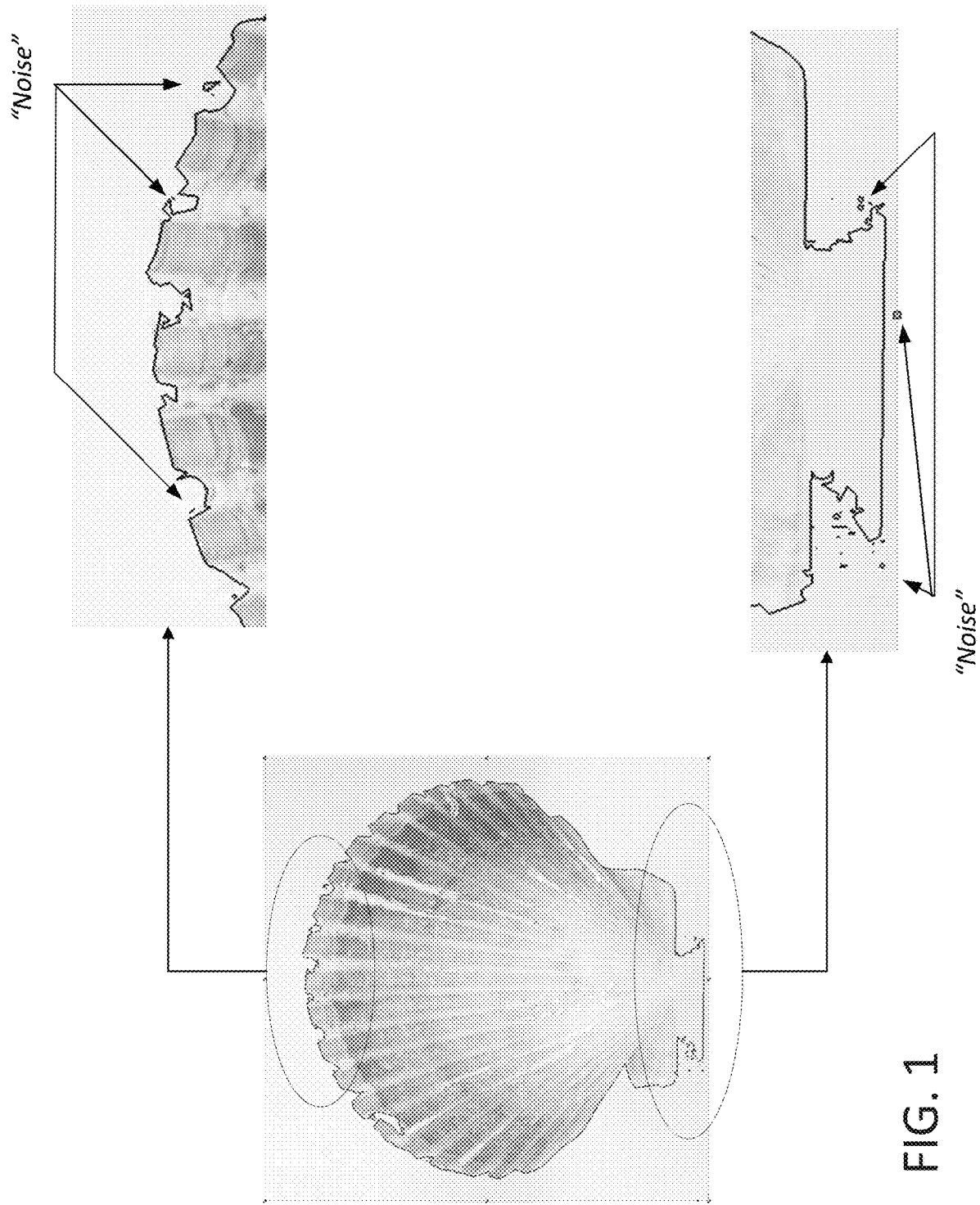
FIG. 1 shows an outline of a sketch of an image created using an AutoTrace command in the Solidworks@ software program.

This document uses a variety of terminology to describe the inventive concepts set forth herein. Unless otherwise indicated, the following terminology, and variations thereof, should be understood as having meanings that are consistent with what follows.

An "image" or digital representation of an image refers to a representation of a real-world object in two dimensions in a computer environment. An image, as used herein, is not readily modifiable, for example, with computer-aided design (CAD) software, but instead, requires modifications to become modifiable with CAD software. More specifically, the image usually cannot be used as is and needs to be interpreted so as to be able to modify its representation in the CAD software. The image can exist in any one of a variety of computer image file formats including, for example, an image file, a DXF file, a DWG file, a pdf file, or as a point cloud. The image may represent, for example, a real-world mechanical drawing, a real-world hand drawing, or a photograph that has been scanned (e.g., with a 3D image scanner) or photographed (e.g., with a 3D camera) to produce the image/digital image.

A "sketch" is a collection of points, lines, circles, ellipses, polygons and/or other similar two dimensional objects in a computer environment on a plane, for example, which forms a feature or the basis for a feature in a CAD program.

An "image scanner" is a device that optically scans real-world images, such as mechanical drawings, hand drawings, or photographs, to produce digital images thereof for storing in computer memory. One exemplary type of image scanner is a desktop flatbed scanner where a document (e.g., drawing or photograph, etc.) is placed on a glass window for scanning.

A "digital camera" is a camera that captures photographs and stores them as digital images in computer memory. A digital camera can be a standalone, dedicated digital camera, or a camera that is incorporated into a mobile device like a smartphone or tablet.

A "grayscale" image is an image, in which a value assigned to each pixel is a single number representing only the brightness of light; that is, it carries only intensity information. A grayscale image appears in black-and-white or gray monochrome, composed exclusively of shades of gray. The contrast can range from black at the weakest intensity to white at the strongest and all the shades in between.

A "contour" is a curve, including a digital representation thereof, that follows a path that corresponds to a boundary in an image. Multiple different contours may be generated from a single image.

An "inflection point" is a point along a curve (e.g., a curve that approximates a contour) at which the curvature changes its sign.

A "corner" is a point where multiple curves intersect to create a sharp region. Two arcs could intersect at a corner point, a line and an arc could intersect at a corner point, or a line and a spline could intersect at a corner point. Also, there could be more than two curves that would intersect at a corner.

A "tangency point" or a "point of tangency" is a point where two curves meet in such a way that their slopes are identical at the point of intersection.

A "Long Short Term Memory" ("LSTM") is an artificial recurrent neural network (RNN) architecture with feedback connections.

A "fillet" is an internal rounding of a corner or edge in a sketch, for example.

A "curve" is a generic term used to reference either a line, an arc, a circle, an ellipse, or a spline in a computer environment.

A "line" is a straight sketch entity with two endpoints.

An "arc" is a curved or arched sketch entity with a uniform curvature along its span and two end points.

A "spline" is a more complex curved sketch entity with varying curvature along its span and two end points. A spline may be constructed, for example, so as to pass through a given set of points and have continuous derivatives at those points.

"Snapping a curve" refers to moving the curve so that it connects to some other entity like a point or a curve (e.g., snap a curve to a point)

Other Technologies

Prior systems exist for converting an image into a sketch. For example, a prior version of the Solidworks@ software program, available from Dassault Systémes SE, included an xDesign™ computer application for three-dimensional (3D) modeling with gesture-based sketching functionality to help convert shapes given by their strokes to known sketch objects. Though this was very useful and powerful, it was restricted in its scope in that it could recognize only a select few known shapes like lines, triangles, rectangles, polygons, circles, etc.

Moreover, the process of converting images using other software packages has not always been user-friendly and has not always created easy-to-use sketches. FIG. 1, for example, shows an outline of an image created using an AutoTrace command in the Solidworks@ software program. The curves created by the AutoTrace command in the illustrated example has resulted in extraneous "noise" entities in the sketch that must be cleaned up by the user. The process has done its best to replicate the shape of the item of interest but has created so many entities that the result is almost unusable due to the amount of cleanup the user will have to do.

Other technical differences may exist between various prior technologies and the systems and techniques disclosed herein.

Technical Disclosure

Figure 2:
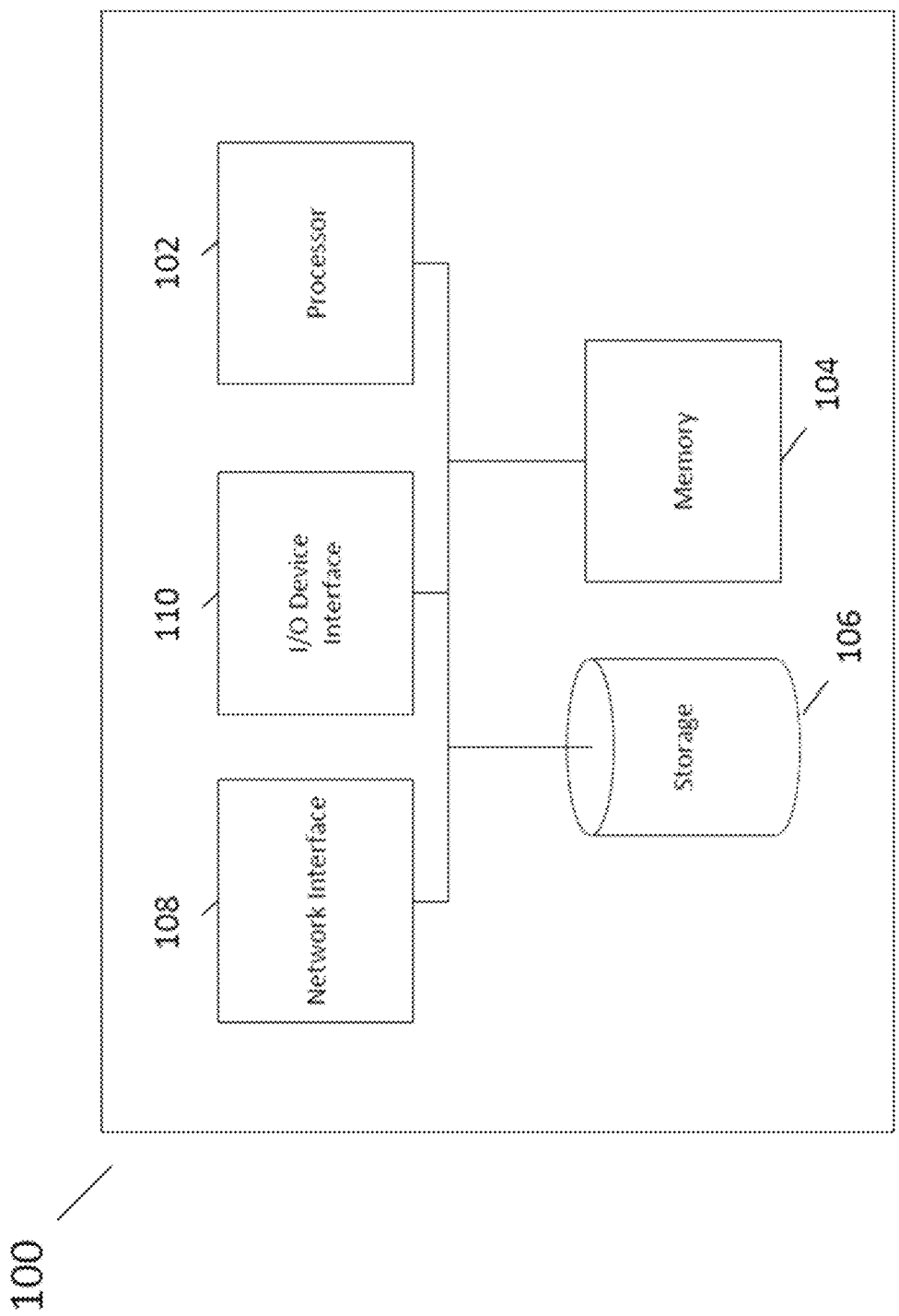
FIG. 2 is a schematic representation of an exemplary implementation of a computer 100 configured to convert an image into a sketch.

FIG. 2 is a schematic representation of an exemplary implementation of a computer 100 configured to convert an image into a sketch.

The illustrated computer 100 has a processor 102, computer-based memory 104, computer-based storage 106, a network interface 108, an input/output device interface 110, and a bus that serves as an interconnect between the components of the computer 100. The bus acts as a communication medium over which the various components of the computer 100 can communicate and interact with one another.

The processor 102 is configured to perform the various computer-based functionalities disclosed herein as well as other supporting functionalities not explicitly disclosed herein. In some implementations, some of the computer-based functionalities that the processor 102 performs include those functionalities disclosed herein as being attributable to any one or more of components 214 to 236 and more. In some implementations, the processor 102 performs these and other functionalities by executing computer-readable instructions stored on a computer-readable medium (e.g., memory 104 and/or storage 106). In various implementations, some of the processor functionalities may be performed with reference to data stored in one or more of these computer-readable media and/or received from some external source (e.g., from an I/O device through the I/O device interface 110 and/or from an external network via the network interface 108). The processor 102 in the illustrated implementation is represented as a single hardware component at a single node. In various implementations, however, the processor 102 may be distributed across multiple hardware components at different physical and network locations.

The computer 100 has both volatile and non-volatile memory/storage capabilities.

In the illustrated implementation, memory 104 provides volatile storage capability for computer-readable instructions that, when executed by the processor 102, cause the processor 102 to perform at least some of the computer-based functionalities disclosed herein. More specifically, in some implementations, memory 104 stores a computer software program that is able to convert an image to a sketch in accordance with the systems and computer-based functionalities disclosed herein. In some implementations, the computer software program may be integrated into, or utilized with, a program that facilitates computer-based manipulation of the sketch that results from the image conversion process. One example of this kind of program is the xDesign™ computer application for three-dimensional (3D) modeling, which is part of the 3D Creator role on the computer-based 3DEXPERIENCE@ platform, available from Dassault Systèmes SE. The computer-based simulation program, so adapted, would have the ability to convert images to sketches, as described herein, and may perform other functionalities as well.

In the illustrated implementation, memory 104 is represented as a single hardware component at a single node in one single computer 100. However, in various implementations, memory 104 may be distributed across multiple hardware components at different physical and network locations (e.g., in different computers).

In the illustrated implementation, storage 106 provides non-volatile memory for computer-readable instructions representing an operating system, configuration information, etc. to support the systems and computer-based functionalities disclosed herein.

In the illustrated implementation, storage 106 is represented as a single hardware component at a single node in one single computer 100. However, in various implementations, storage 106 may be distributed across multiple hardware components at different physical and network locations (e.g., in different computers).

The network interface 108 is a component that enables the computer 100 to connect to, and communicate over, any one of a variety of different external computer-based communications networks, including, for example, local area networks (LANs), wide area networks (WANs) such as the Internet, etc. The network interface 108 can be implemented in hardware, software, or a combination of hardware and software.

The input/output (I/O) device interface 110 is a component that enables the computer 100 to interface with any one or more input or output devices, such as a keyboard, mouse, display, microphone, speakers, printers, image scanners, digital cameras, etc. In various implementations, the I/O device interface can be implemented in hardware, software, or a combination of hardware and software. In some implementations, the computer may include one or more I/O devices (e.g., a computer screen, keyboard, mouse, printer, touch screen device, image scanner, digital camera, etc.) interfaced to the computer 100 via 110. These I/O devices (not shown in FIG. 2) act as human-machine-interfaces (HMIIs) and are generally configured to enable a human user to interact with the system 100 to access and utilize the functionalities disclosed herein.

In an exemplary implementation, the computer 100 is connected to a display device (e.g., via the I/O device interface 110) and configured to present at the display device a visual representation of an interface to an environment that provides access to the functionalities disclosed here.

In some implementations, the computer 100 and its various components may be contained in a single housing (e.g., as in a personal laptop) or at a single workstation. In some implementations, the computer 100 and its various components may be distributed across multiple housings, perhaps in multiple locations on a network. Each component of the computer 100 may include multiple versions of that component, possibly working in concert, and those multiple versions may be in different physical locations and connected via a network. For example, the processor 102 in FIG. 2 may be formed from multiple discrete processors in different physical locations working together to perform processes attributable to the processor 102 as described herein, in a coordinated manner. A wide variety of possibilities regarding specific physical configurations are possible.

In various implementations, the computer 100 may have additional elements not shown in FIG. 2. These can include, for example, controllers, buffers (caches), drivers, repeaters, receivers, etc. The interfaces (e.g., 108, 110) in particular may include elements not specifically represented in FIG. 2, including, for example, address, control, and/or data connections to facilitate communications between the illustrated computer components.

Figure 3:
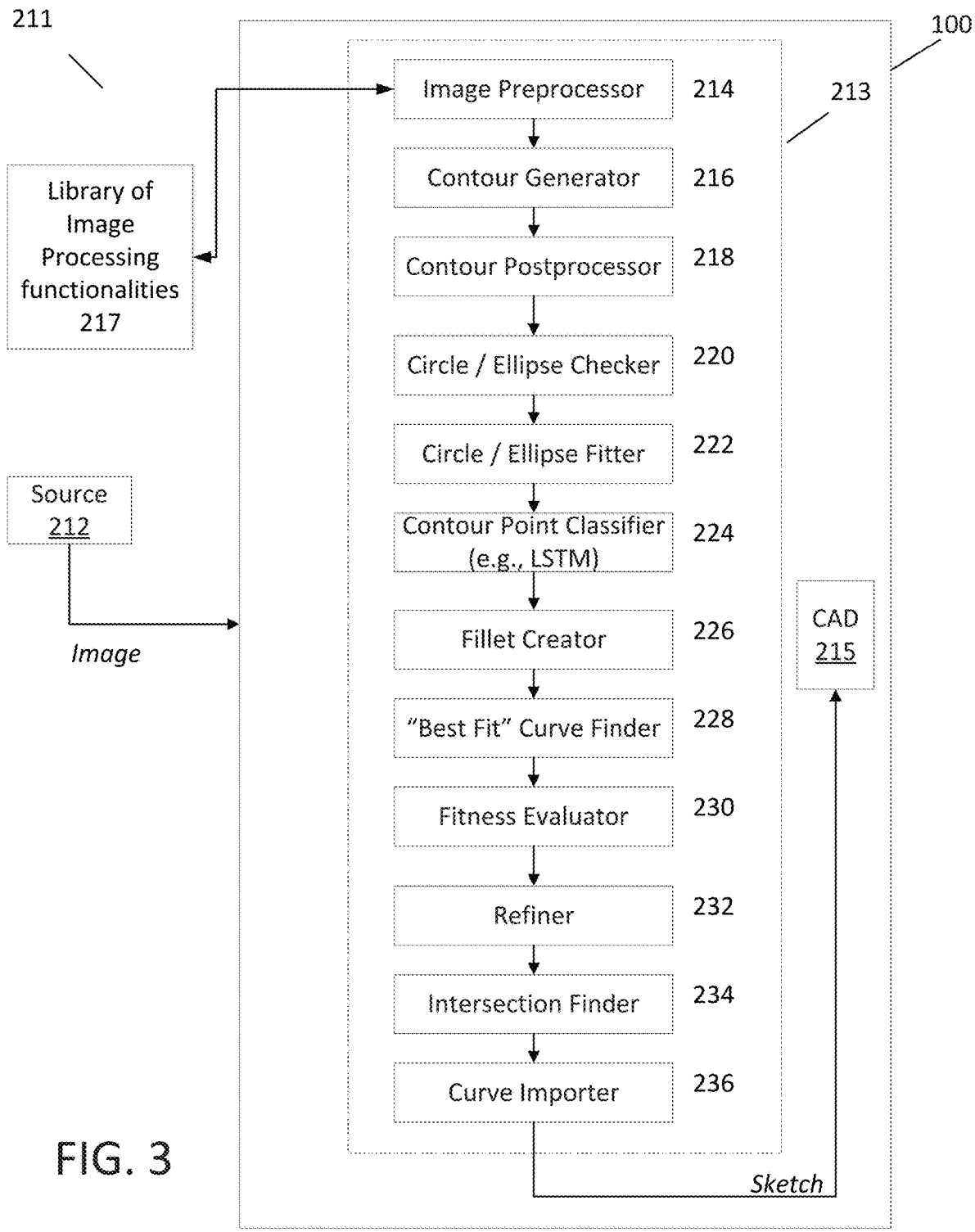
FIG. 3 is a schematic representation of an exemplary implementation of a system that includes a computer configured to convert an image into a sketch.

FIG. 3 is a schematic representation of an exemplary implementation of a system 211 that includes a computer 100 configured to convert an image into a sketch.

The illustrated system 211 has an image source 212 coupled to the computer 100, which includes an image-to-sketch converter 213, a library of image processing functionalities 217, and a computer-aided design (CAD) program 215. The image source 212 is configured to provide an image to the image-to-sketch converter 213. The image-to-sketch converter 213 is configured to convert the image into a sketch. After conversion, according to the illustrated implementation, the sketch is made available to the CAD program 215.

The image source 212 can be any one of a variety of devices or system components that can make an image available for conversion to the computer 100. Exemplary image sources 212 include image scanners, digital cameras, and computer memory storing images in a format that can be accessed by the computer 100. In various implementations, the image source 212 can be inside or external to the computer 100. As an example, if the image source 212 is computer memory, the computer memory can be either inside or external to the computer 100. If the image source is external to the computer 100, then the image may be provided to the computer 100 via one of its interfaces—e.g., network interface 108 or I/O device interface 110.

The image-to-sketch converter 213, in the illustrated implementation, has several components including an image preprocessor 214, a contour generator 216, a contour post-processor 218, a circle/ellipse checker 220, a circle/ellipse fitter 222, a contour point classifier 224, a fillet creator 226, a "best fit" curve finder 228, a fitness evaluator 230, a refiner 232, an intersection finder 234, and a curve importer 236. Each of these components is configured to perform associated functionalities, as disclosed herein, to convert an image into a sketch. The components can take on any one of a variety of different forms. In an exemplary implementation, each component is implemented by the processor 102 executing computer-readable instructions stored on a non-transitory computer readable medium, such as memory 103 and/or storage 104, that, when executed by a computer-based processor, cause the computer 100 to convert an image into a sketch.

The library of image processing functionalities 217 is a computerized library that includes computer-readable instructions for performing certain image processing functions. In various implementations, the library 217 may be stored on the computer 100 itself (e.g., in 104 or 106). In various implementations, the library 217 may be stored outside the computer 100. In one implementation, the library 217 is OpenCV™, a large, open-source BSD-licensed library of computer vision algorithms. Some such algorithms may include algorithms for converting an image to grayscale and/or increasing contrast in an image. Other algorithms may be available as well.

The CAD program 215 in the computer 100 is configured to receive the sketch that results from the conversion process. In some implementations, the CAD program 215 is configured to enable a human user to view, edit, analyze, and/or utilize the sketch as a feature or as the basis for a feature in a design on the CAD program 215. In various implementations, the sketch may be provided to any one of a variety of other software programs, instead of or in addition to the CAD program. In some implementations, once converted, the sketch may be stored (e.g., in memory 104).

Figure 4:
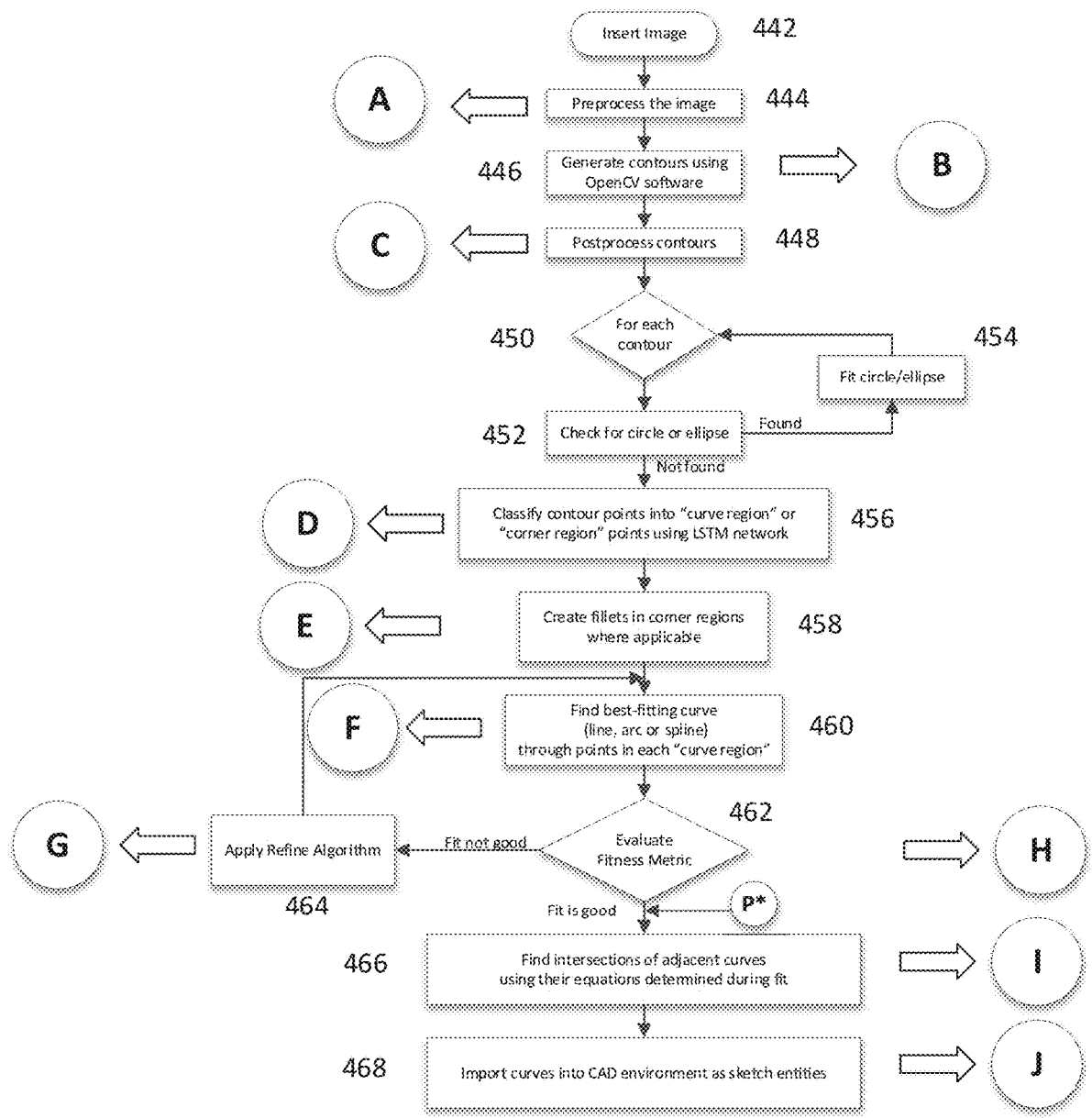
FIG. 4 is a flowchart showing an overview of a process for converting an image into a sketch.

FIG. 4 is a flowchart showing an overview of a process for converting an image into a sketch. Some of the steps in the illustrated process have pointers to other later drawings that include additional details about those steps.

The first step in the illustrated flowchart (at 442) involves inserting or loading the image into the image-to-sketch converter 213. In some implementations, this step involves obtaining an image and/or transferring an image from a source 212 to the image-to-sketch converter 213. In some implementations, the computer 100 may present, at its display, a user interface that enables the user to select an image (e.g., from a library of previously scanned images) for inserting or loading into the image-to-sketch converter 213. In those implementations, the user's selections through the user interface initiates and causes a digital representation of the selected image to be transferred (e.g., from the library) into the image-to sketch converter 213. In some implementations, the image is scanned (e.g., with a 3D scanner) at 442 and the resulting digital representation of the image may be transferred automatically or in response to a prompt from the human user into the image-to-sketch converter 213.

Figure 5:
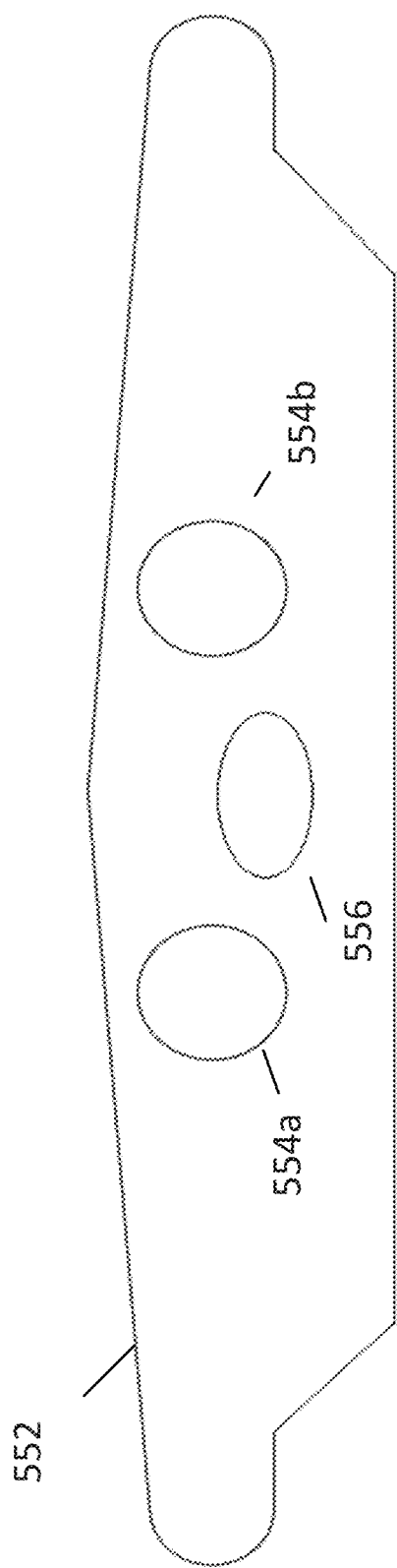
FIG. 5 is an example of an image that might be inserted into the image-to-sketch converter.

FIG. 5 is an example of an image 550 that might be inserted or loaded into the image-to-sketch converter 213 (at 442 in FIG. 4). The illustrated image has an outer edge or boundary 552, two internal circles 554a, 554b, and a single internal ellipse 556. The image that is imported or inserted into the image-to-sketch converter 213 can of course be an image of virtually anything. The illustrated image is exemplary only.

Next, according to the illustrated process, the image preprocessor 214 (at 444) preprocesses the image.

Figure 6:
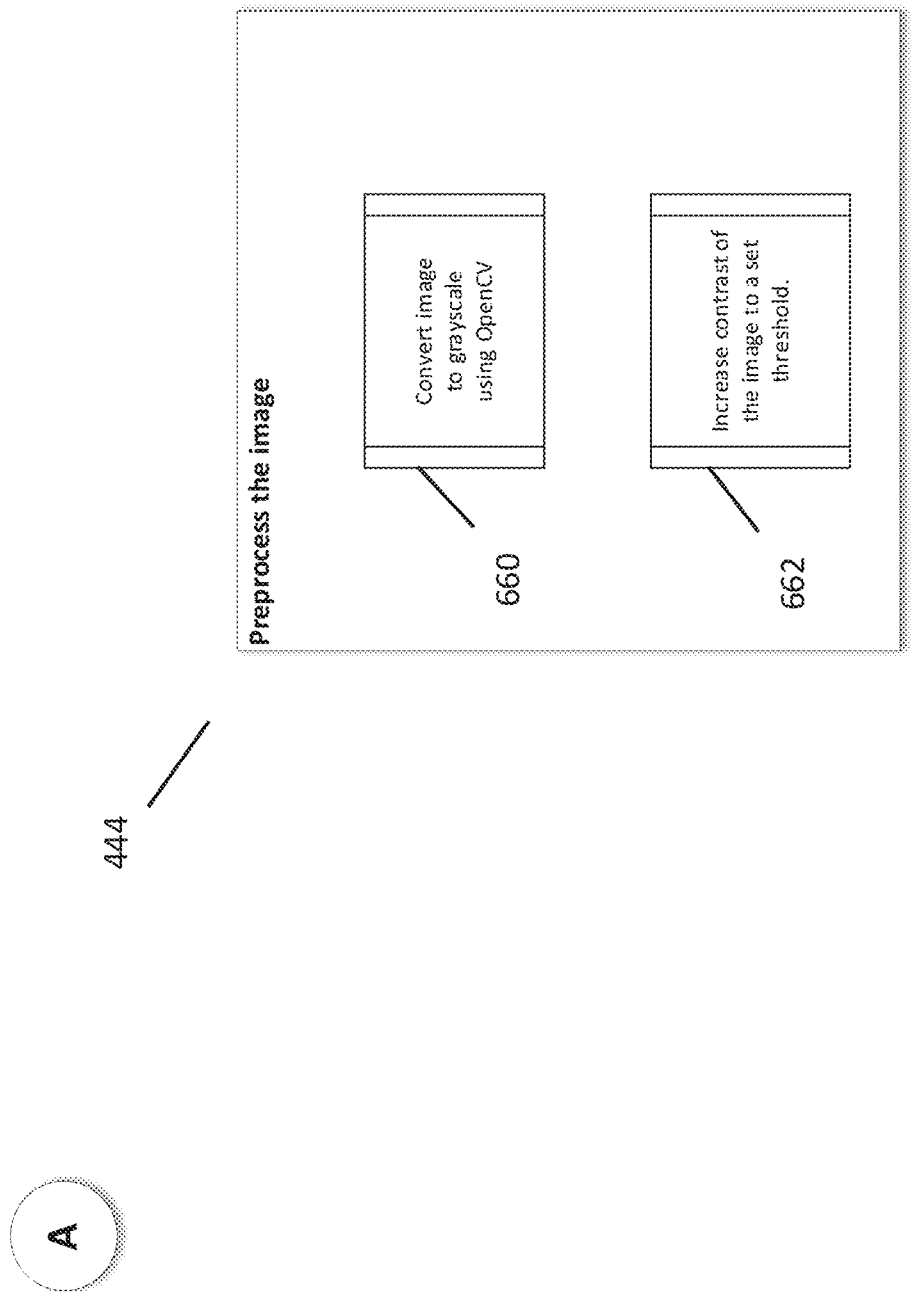
FIG. 6 is a flowchart showing steps involved in an exemplary implementation of image preprocessing.

FIG. 6 is a flowchart showing steps involved in an exemplary implementation of image preprocessing (444).

According to the illustrated flowchart, the image processing (444) includes first, converting the image to grayscale (at 660). In some implementations, this step (660) may be performed by accessing functionalities on the library 217. The OpenCV™ library, for example, provides an application programming interface (API) for this sort of function. In an implementation that utilizes the OpenCV™ library, for example, the image preprocessor 214 may call the OpenCV™ API for converting the image to grayscale in order to implement the step at 660.

Next, according to the illustrated flowchart, the image preprocessing (444) includes increasing contrast of the image to a set threshold. This step helps ensure that the image's contours can be more distinctly recognized. In some implementations, this step too is performed by the image preprocessor accessing functionalities in the library 217.

Referring again to FIG. 4, after the image is preprocessed (at 444), the contour generator 216 generates contours based on the preprocessed version of the image (at 446). In an exemplary implementation, the contours are generated utilizing contour generating functionality available in the library 217 (e.g., the OpenCV™ software library).

Figure 7:
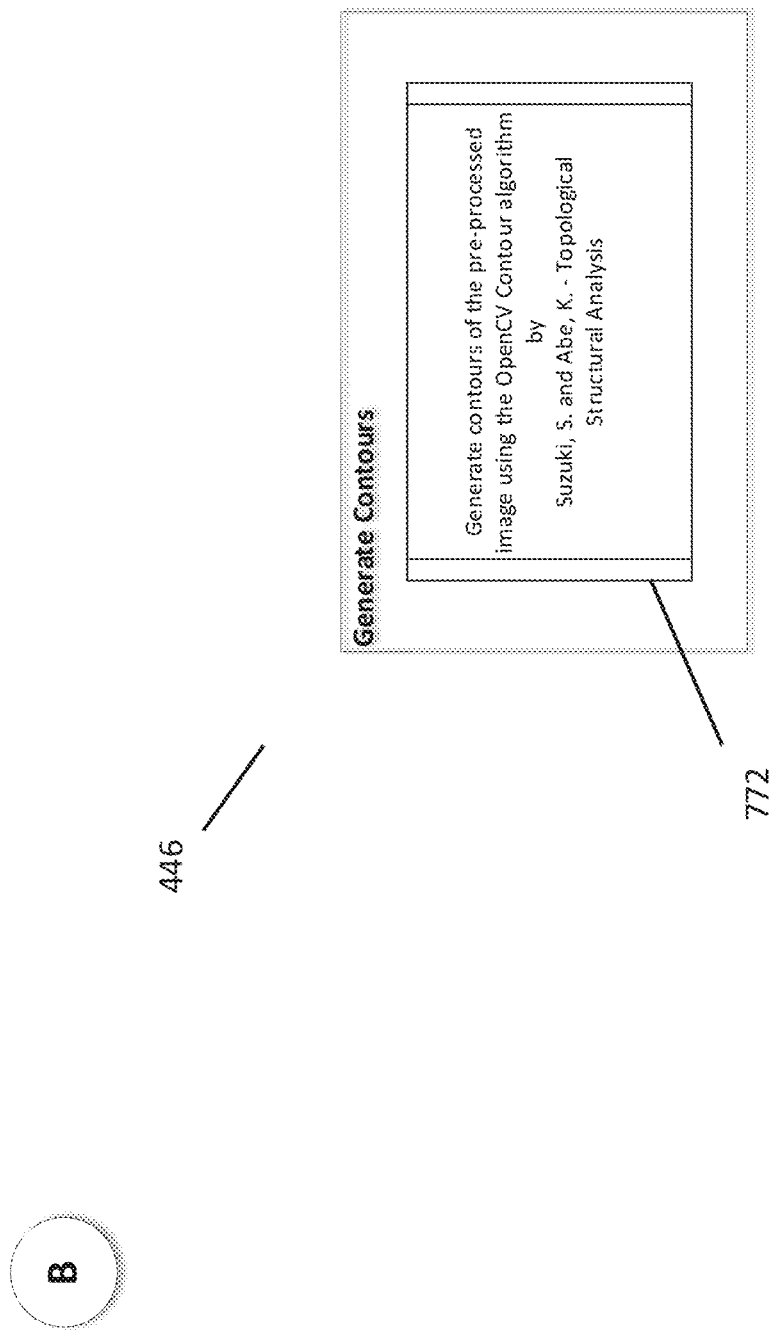
FIG. 7 is a chart showing information about contour generation according to one exemplary implementation.

FIG. 7 provides additional information about contour generation (at 446) in one exemplary implementation. According to the illustrated representation, the contours are generated based on the preprocessed image using an algorithm available (e.g., the findContour( ) function that helps in extracting the contours from an image) in the OpenCV™ software library. In an exemplary implementation, the algorithm is based on processes described in an article by Satoshi Suzuki, entitled, *Topological structural analysis of digitized binary images by border following* that appeared in Computer Vision, Graphics, and Image Processing, volume 30, issue 1, April 1985, on pages 32-46. That article is incorporated herein by reference in its entirety.

In one exemplary implementation, the algorithm used by OpenCV™ for fitting circles and ellipses is as follows. Circle fitting is based on finding the smallest circle that encloses the given contour points. This is referred to as a Welzl's Algorithm, which is a recursive algorithm that is described, for example, on the Smallest-circle problem page on the Wikipedia website. It is implemented in the OpenCV API function minEnclosingCircle( ). Ellipse fitting is based on Fitzgibbon's algorithm which is described, for example, in an article entitled, *A Buyer's Guide to Conic Fitting*, by Andrew Fitzgibbon and Robert B. Fisher. published in British 1 Jul. 1995. It is implemented in the OpenCV API function fitEllise( ). In order to decide this, we need to compute the contour area which is done using the OpenCV API function contourArea( ).

Figure 8:
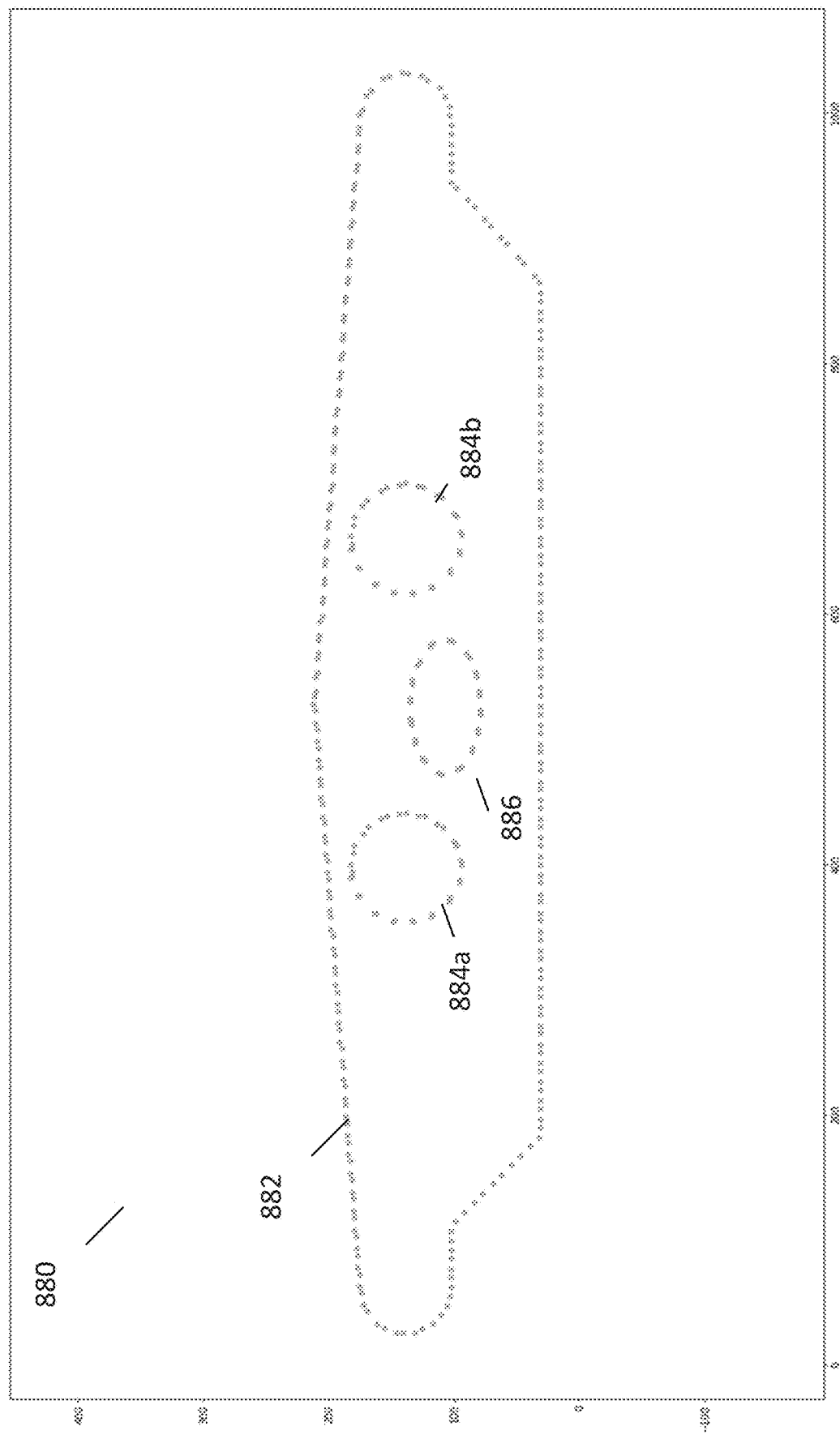
FIG. 8 shows an example of points generated by a boundary detection software like OpenCV from the contours of the image.

FIG. 8 shows an example of a visual representation 880 that the computer 100 might produce while generating contours (at 446) from the image shown in FIG. 5. Contours are curves and not a sequence of points—but there is no generic way to represent contours as curves while using OpenCV. So the system here provides (or represents) contours in the form of sequences of points.

As shown in FIG. 8, the visual representation 880 includes sequences of points that follow paths that correspond to boundaries in the image of FIG. 5. More specifically, the sequence of points in FIG. 8 include a first sequence of points 882 that follow a path that corresponds to the outer boundary (552) of the image, a second and third sequence of point 884a, 884b that follow paths that correspond to the internal circles 554a, 554b of the image, and a fourth sequence of points 886 that follows a path that corresponds to the single internal ellipse 556 in the image.

Figure 9:
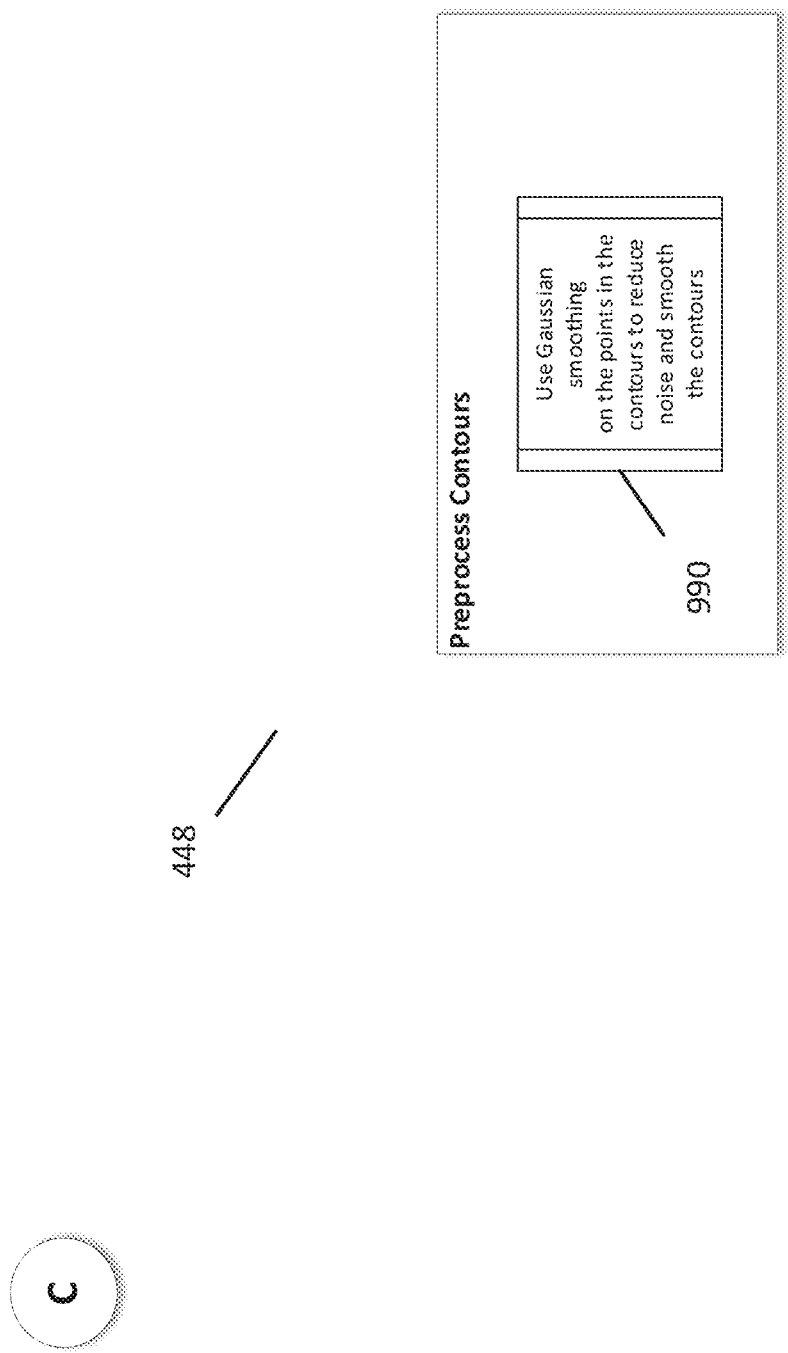
FIG. 9 is a chart showing information about postprocessing generated contours.

Referring again to FIG. 4, after the sequences of points are generated (446), the contour postprocessor 218 postprocesses the generated sequences of points (at 448). FIG. 9 provides additional information about postprocessing the generated sequences of points (at 448) according to one exemplary implementation. According to the illustrated representation, the contour postprocessor 218 (at 990) uses Gaussian smoothing on the points generated by the contour generation process.

Figure 10:
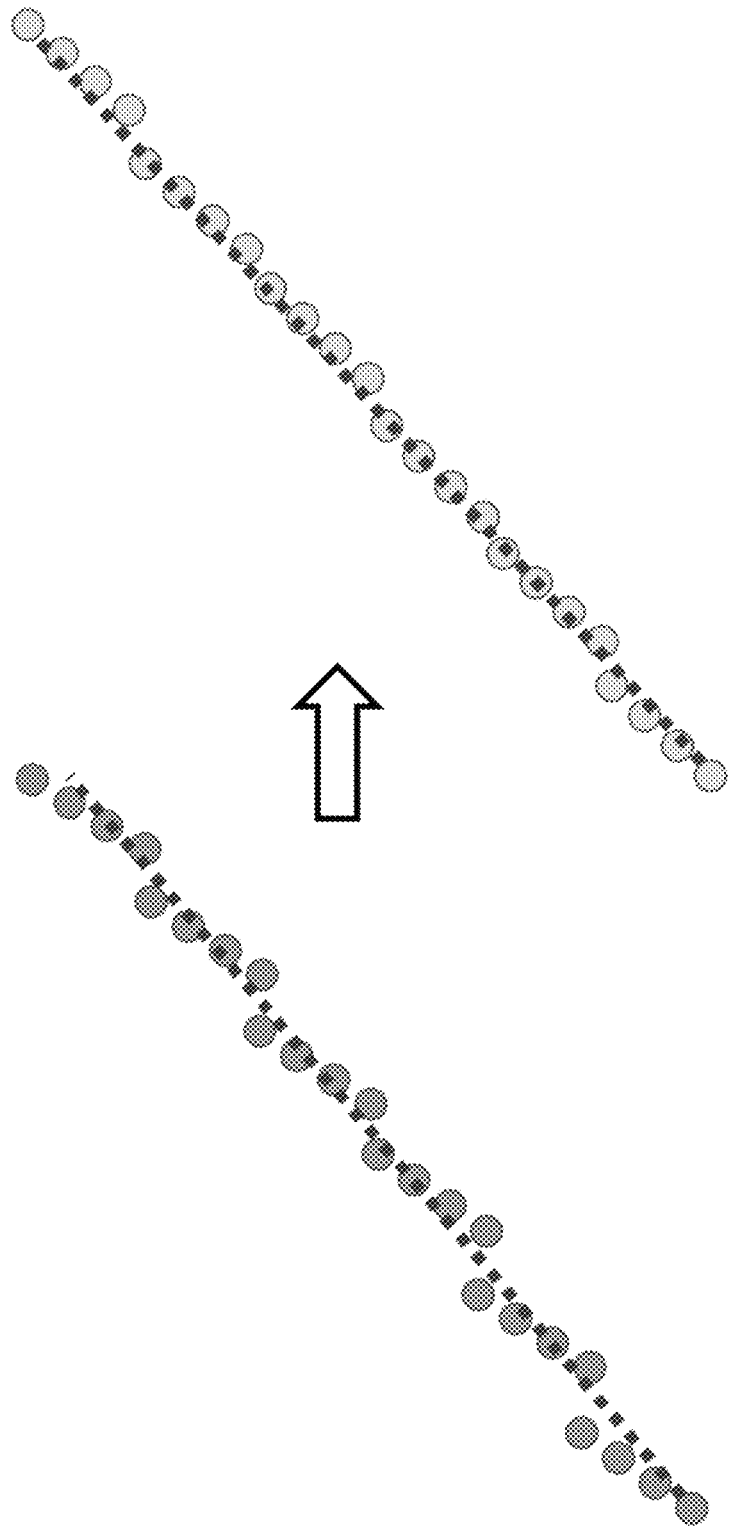
FIG. 10 shows a qualitative example of how Gaussian smoothing might modify a particular sequence of points along a portion of a contour.

FIG. 10 shows a qualitative example of how Gaussian smoothing might modify a particular sequence of points along a portion of a contour. As shown, the points in the post-Gaussian smoothing sequence (downstream of the arrow) follow a straighter path than the points in the pre-Gaussian smoothing sequence (upstream of the arrow).

More specifically, in the illustrated example, the points in the pre-Gaussian smoothing sequence (upstream of the arrow) follow a pattern whereby a first segment of four sequential points are somewhat aligned with one another and then there is a step to a second segment of four sequential points that are somewhat aligned with one another, and then there is another step to a third similar segment of four sequential points, and so on. The points in the post-Gaussian smoothing sequence (downstream of the arrow) follow a similar pattern. However, most notable, the steps between adjacent segments in the post-Gaussian smoothing sequence are smaller than the corresponding steps between adjacent segments in the pre-Gaussian smoothing sequence. Moreover, in some instances, the sequential points within a particular segment may be aligned a bit better in the post-Gaussian smoothing sequence than in the pre-Gaussian smoothing sequence. Thus, in some implementations, the contours that emerge from the contour postprocessing (at 448) appear less jagged (and smoother) than the contours before contour postprocessing.

In some implementations, the same sort of effect would be realized for points that follow an arc or a spline, whereby the points in the post-Gaussian smoothing sequence would follow an arc or spline-shaped path more closely than corresponding points in a pre-Gaussian smoothing sequence of points that correspond to the arc or splice.

Referring again to FIG. 4, after contour postprocessing (at 448), the computer 100—more specifically, the computer's circle/ellipse checker 220—checks (at 452) each contour (450) whether that contour corresponds to a circular or elliptical boundary. If so, then the computer 100—more specifically, the computer's circle/ellipse fitter 222—(at 454) fits a circle or ellipse, as appropriate, to that contour.

Thus, with respect to the contour map 800 in FIG. 8, the computer 100 (at 452) might first check whether contour 882, for example, corresponds to a circular or elliptical boundary. The computer 100 would determine in this instance that the contour in question (882) does not correspond to a circular or elliptical boundary. Next, the computer 100 (at 452 again) might check whether contour 884a, for example, corresponds to a circular or elliptical boundary. The computer 100 would determine in this instance that the contour in question (884a) corresponds to a circular boundary. Thus, the computer 100 (at 454) would fit a circle to the contour 884a at issue. Next, the computer 100 (at 452 again) might check whether contour 886, for example, corresponds to a circular or elliptical boundary. The computer 100 would determine in this instance that the contour in question (886) does not correspond to a circular boundary but rather an elliptical boundary. Thus, the computer 100 (at 454) would fit an ellipse to the contour 886 at issue. Finally, the computer 100 (at 452 again) might check whether contour 884b, for example, corresponds to a circular or elliptical boundary. The computer 100 would determine in this instance that the contour in question (884b) corresponds to a circular boundary. Thus, the computer 100 (at 454) would fit a circle to the contour 884b at issue.

There are a variety of ways in which the computer 100 (at 452) may check whether a particular contour corresponds to a circle or elliptical boundary.

There are also a variety of ways in which the computer 100 (at 454) may fit a circle or ellipse to a contour identified as corresponding to a circle or ellipse.

Thus, at the end of 450, 452, 454 in FIG. 4, the computer 100 will have assigned circles or ellipses, as appropriate, to any contours that correspond to a circle or ellipse, respectively. Any other (non-circular and non-elliptical) contours from the image are handled subsequently, according to the illustrated flowchart. Referring back again to the contour map 800 in FIG. 8, the computer 100, after 450, 452, and 454 in FIG. 4, will have assigned appropriated sized circles to contours 884a, and 884b, and will have assigned an appropriately sized ellipse to contour 886. Contour 882 will have been left for subsequent handling.

Figure 11C:
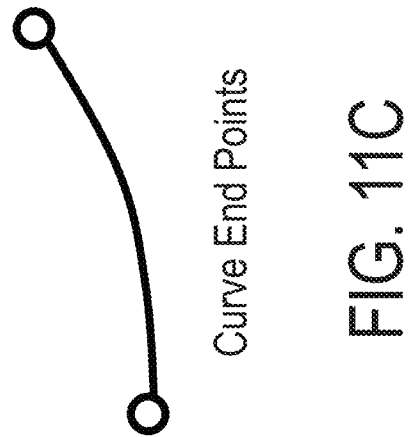
FIGS. 11A to 11C show exemplary corner points.
Figure 11B:
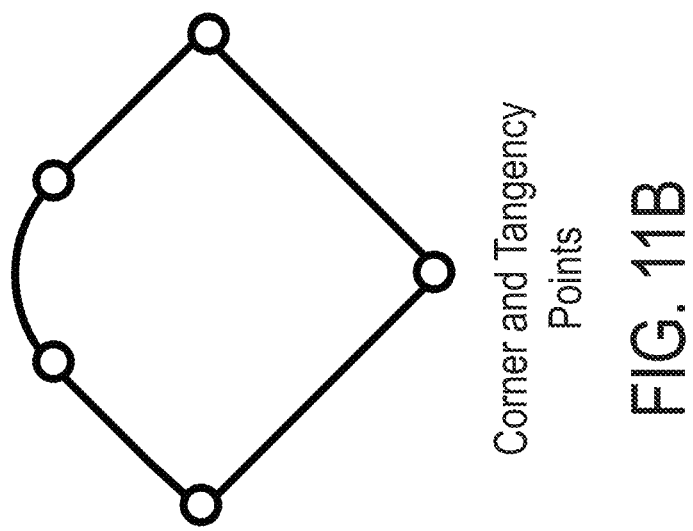
Figure 11A:
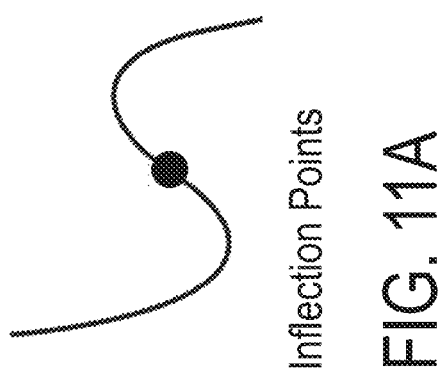

Referring again to the flowchart of FIG. 4, after 450, 452, and 454, for any non-circular, non-elliptical contours, the contour point classifier 224 (at 456) classifies each contour point into either "curve region" contour points or "corner region" contour points. In an exemplary implementation, "corner region" contour points are contour points that exist at inflection points (see FIG. 11A), corner points or tangency points (see FIG. 11B), or curve end points (see FIG. 11C), whereas "curve region" contour points include all other contour points (i.e., any contour points that fall between two adjacent sets of "corner region" contour points. In some implementations, classifying the contour points into "curve region" contour points or "corner region" contour points is performed using an appropriately trained Long short-term memory ("LSTM"). In some implementations, the LSTM is implemented as an artificial recurrent neural network (RNN) architecture with feedback connections via a computer processor (e.g., 102) executing computer-readable instructions stored on a computer-readable medium (e.g., 104, 106) to perform classification functionalities, for example. In some implementation, the contour point classifier 224 in FIG. 3 includes the LSTM.

Figure 12:
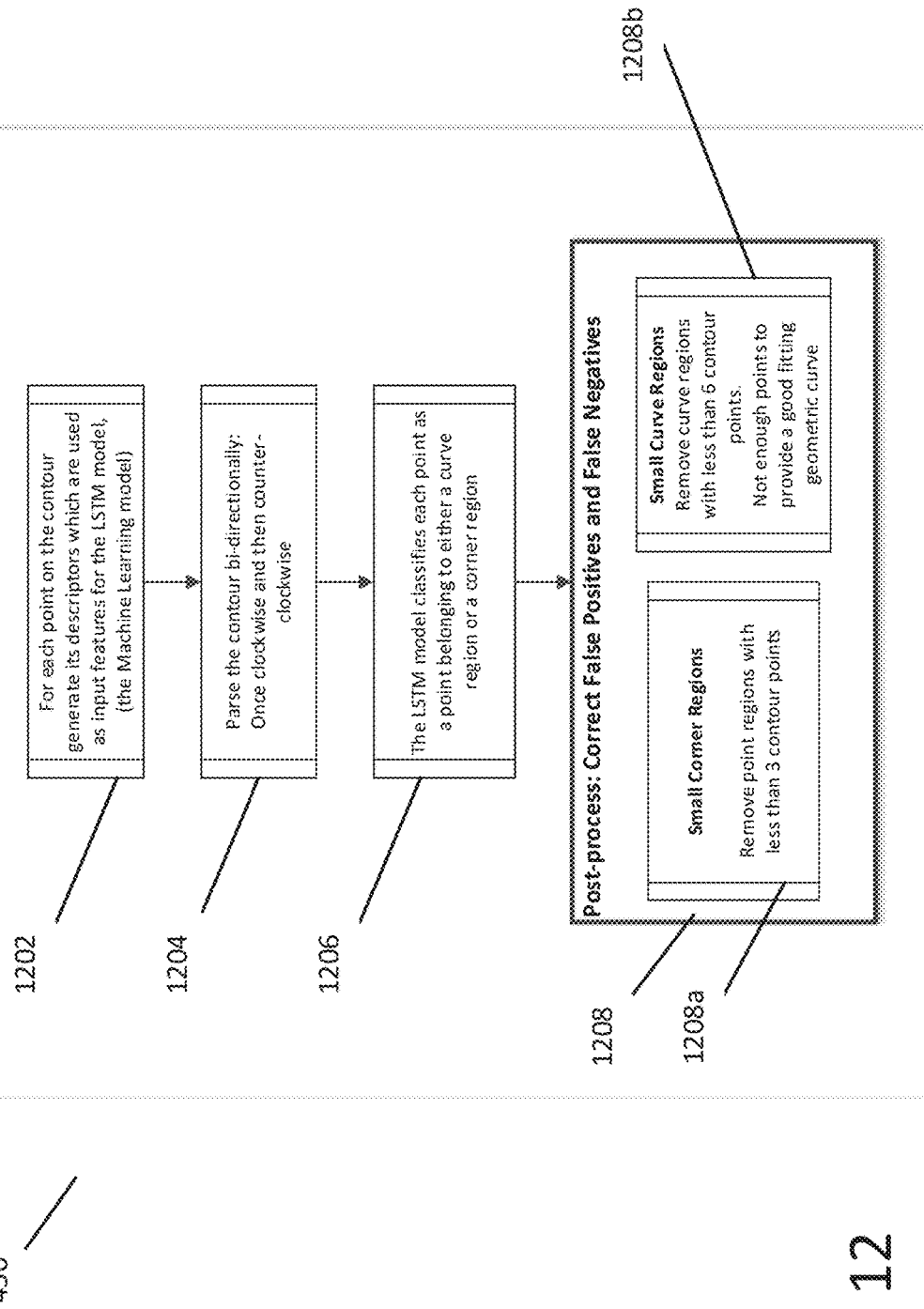
FIG. 12 is a flowchart showing steps involved in an exemplary implementation of image preprocessing.

FIG. 12 is a flowchart showing steps involved in an exemplary implementation of image preprocessing (444). According to the illustrated flowchart, for each point on the contour, the computer 100 (e.g., the contour point classifier 224) (at 1202) generates descriptors that are used as input features for the LSTM. In some implementations, the LSTM will have been trained to output classifications for each contour point as being a "curve region" contour point or a "corner region" contour point based on the input features (or descriptors) for that contour point.

Figure 13:
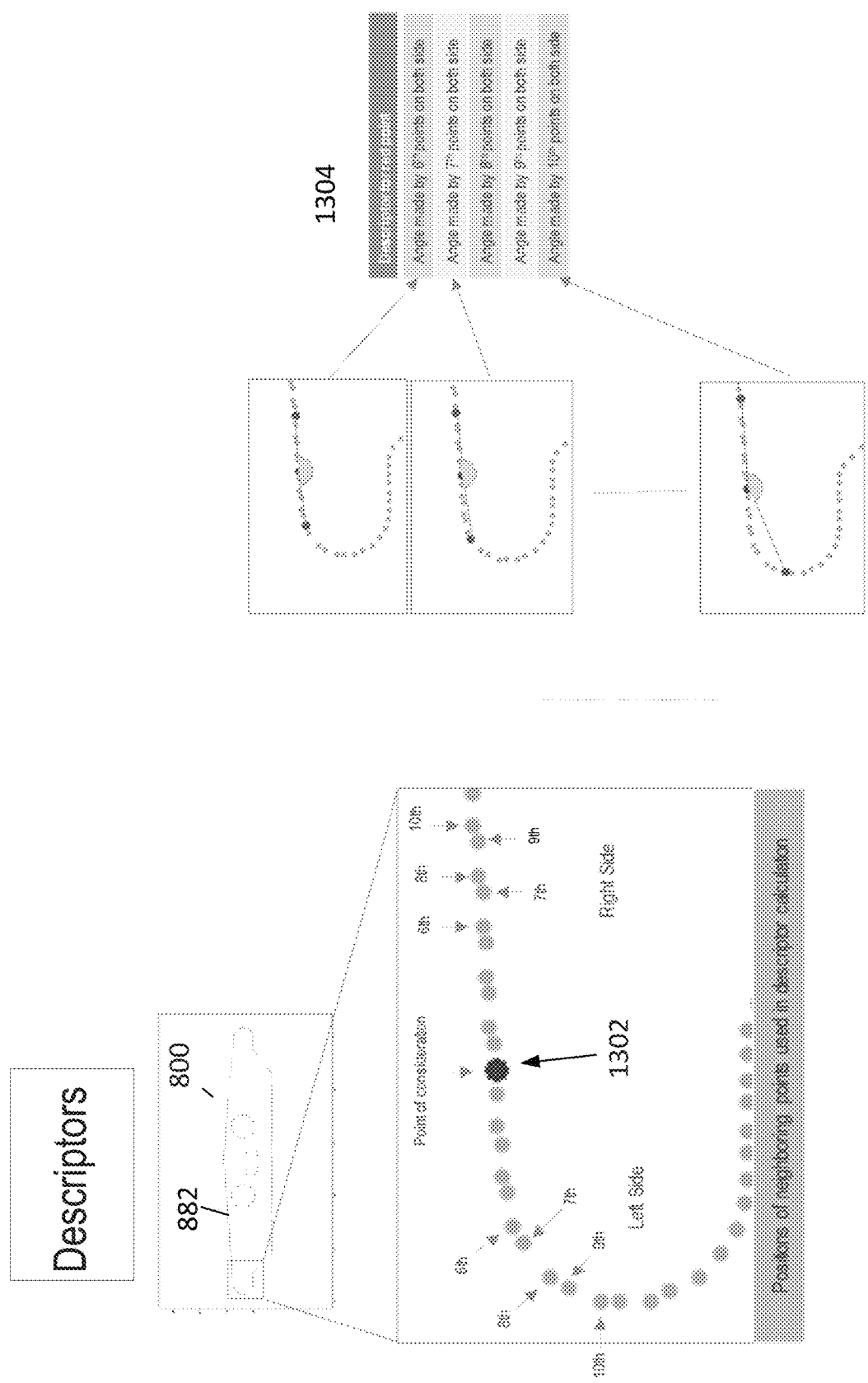
FIG. 13 shows a point of consideration among a sequence of contour points in a portion of a contour map and an exemplary set of descriptors that correspond to the point of consideration.

FIG. 13 shows a point of consideration 1302 among a sequence of contour points in a portion of the contour map 800 and an exemplary set of descriptors 1304 that correspond to the point of consideration 1302. More specifically, the point of consideration 1302 in the illustrated example, is along contour 882 in contour map 800. According to the illustrated example, the computer 100 identifies the descriptors 1304 for the point of consideration 1302 by measuring the angles produced at the point of consideration 1304 when lines are drawn from the point of consideration to, respectively, the $6^{th}$, $7^{th}$, $8^{th}$, $9^{th}$ and $10^{th}$ contour points on both sides of the point of consideration.

So, in an exemplary implementation, the computer 100 first determines what the angle would be between a first straight line extending from the point of consideration 1302 to a point that is six contour points away from the point of consideration in a first direction (e.g., in a clockwise direction) and a second straight line extending from the point of consideration 1302 to a point that is six contour points away from the point of consideration in a second direction (e.g., in a counterclockwise direction). Next, the computer 100 determines what the angle would be between a first straight line extending from the point of consideration 1302 to a point that is seven contour points away from the point of consideration in the first direction (e.g., in the clockwise direction) and a second straight line extending from the point of consideration 1302 to a point that is seven contour points away from the point of consideration in the second direction (e.g., in the counterclockwise direction). Next, the computer 100 determines what the angle would be between a first straight line extending from the point of consideration 1302 to a point that is eight contour points away from the point of consideration in the first direction (e.g., in the clockwise direction) and a second straight line extending from the point of consideration 1302 to a point that is eight contour points away from the point of consideration in the second direction (e.g., in the counterclockwise direction). Next, the computer 100 determines what the angle would be between a first straight line extending from the point of consideration 1302 to a point that is nine contour points away from the point of consideration in the first direction (e.g., in the clockwise direction) and a second straight line extending from the point of consideration 1302 to a point that is nine contour points away from the point of consideration in the second direction (e.g., in the counterclockwise direction). Next, the computer 100 determines what the angle would be between a first straight line extending from the point of consideration 1302 to a point that is ten contour points away from the point of consideration in the first direction (e.g., in the clockwise direction) and a second straight line extending from the point of consideration 1302 to a point that is ten contour points away from the point of consideration in the second direction (e.g., in the counterclockwise direction). In this example, the descriptor 1304 for the point of consideration 1302 would be a set of five values for angles. This set of five values for angles provide a rough indication of local geometry of the contour 882 within ten contour points in each direction of the point of consideration 1302.

In the illustrated example, the angles are measured from the point of consideration to points that are a range of points (N1 to N2) away from the point of consideration in both directions. In the example above (and represented in FIG. 13), that range, denoted by N1 to N2, is six to ten (N1 is six and N2 is ten). This range can vary i.e., the values of N1 and N2 can vary. However, the range will typically not start at one; in other words N1 will be greater than one in order to avoid any noise arising from very close points. So, for example, the computer 100 typically will not determine the angles created by lines starting from the point of consideration to its immediate neighbors on both sides.

All the angles made by these lines (from 6th to 10th) collectively form the descriptor. It is not just a single number but a collection of numbers. This example shows angles but it could be any combination of any such geometric metrics like slope of these lines or tangent of angle made by each line or distance of these points from the point of consideration or average of angles or slopes made by the range of points, etc. There can be many such descriptors based on the distribution of points around the point of consideration. Also, the descriptor can have any length—here we are using a descriptor of length 5 (from point 6 to point 10) but it can have any length 5, 6, 10, 12, 15, 20 or higher or lower.

In some implementations, the computer 100 performs the foregoing processes (identifying descriptors) for each point on the contour 882, at the end of which, the computer 100 (e.g., the contour point classifier 224) will have generated descriptors for each respective one of the contour points on the contour 882. More specifically, according to the illustrated example, after 1202 each respective one of the contour points will have descriptors that identify an angle that would be made by connecting that point to the $6^{th}$ contour point on both sides, an angle that would be made by connecting that point to the $7^{th}$ contour point on both sides, an angle that would be made by connecting that point to the $8^{th}$ contour point on both sides, an angle that would be made by connecting that point to the $9^{th}$ contour point on both sides, and an angle that would be made by connecting that point to the $10^{th}$ contour point on both sides.

LSTM networks tend to be well-suited for classifying, processing, and making predictions based on time series data. The LSTM described herein, however, is used to classify data that is not temporal in nature. To minimize the risk of error from the LSTM's use in connection with a non-temporal data set, because the LSTM is well-suited for temporal data sets, the computer 100 (at 1204) parses the contour bi-directionally—once clockwise and once counterclockwise.

Figure 14:
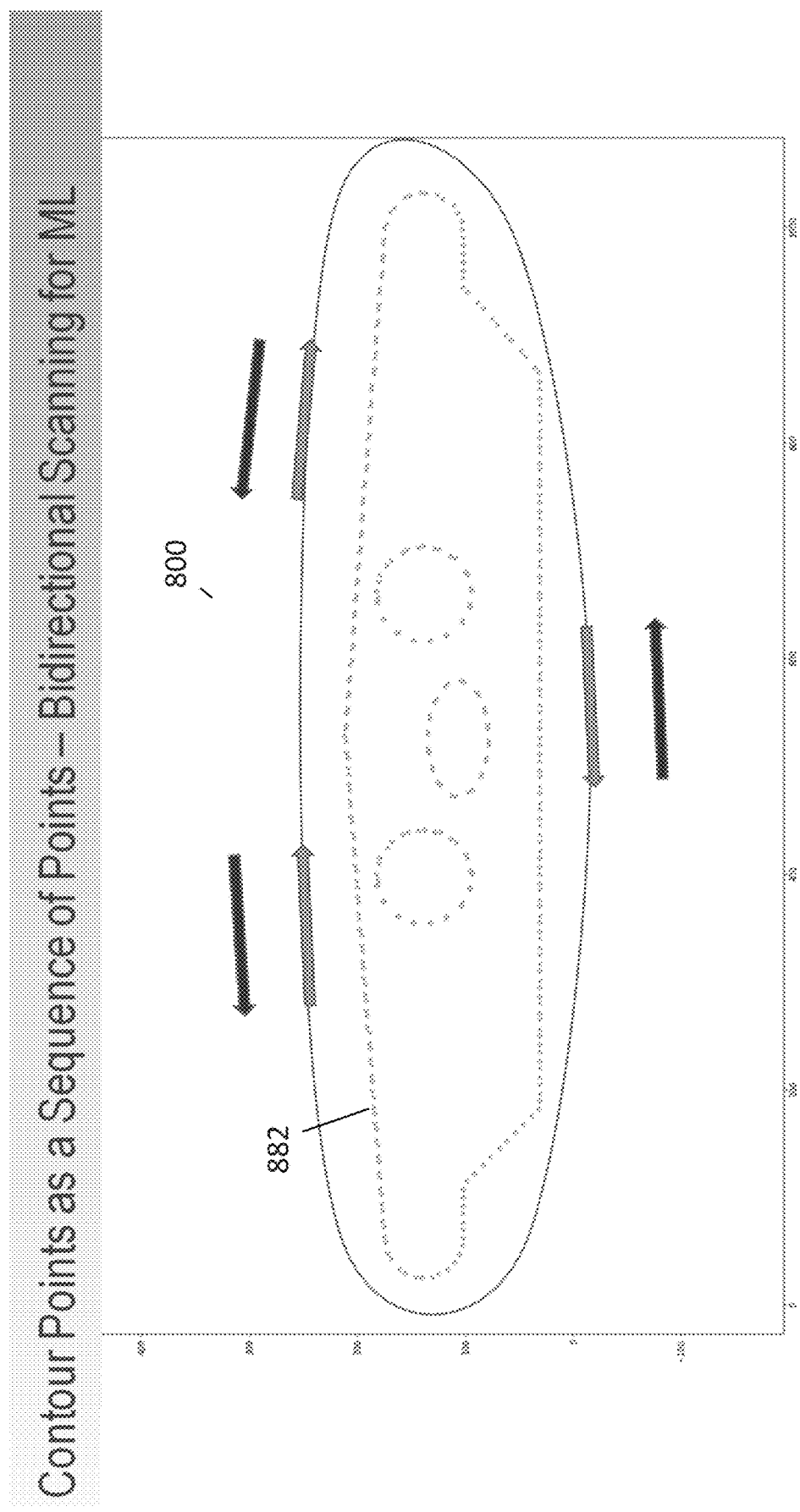
FIG. 14 represents an example of bi-directional processing on a contour map.

FIG. 14 illustrates this bi-directionality concept in connection with contour map 800. As shown in FIG. 14, the computer 100, according to the illustrated example, parses the contour 882 in two directions clockwise (represented by the arrows that are closer to the contour 882) and counterclockwise (represented by the arrows that are farther from the contour 882). Essentially, in an exemplary implementation, this means that the computer 100 feeds the input features for each respective one of the contour points of the contour 882 into the LSTM one at a time, sequentially, in a first (e.g., clockwise) direction. Then, the computer 100 feeds the same input features for each respective one of the contour points of the contour 882 into the LSTM one at a time, sequentially, in a second (e.g., counterclockwise) direction.

Each time the input features for a contour point are fed into the LSTM, the LSTM (at 1206) classifies that point as being a "corner region" contour point or a "curve region" contour point. The bi-directional parsing (at 1204) causes the LSTM to make two predictions for each contour point in the contour (e.g., 882)—a first prediction when the contour is being traversed in the first (e.g., clockwise) direction, and a second prediction when the contour is being traversed in the second (e.g., counterclockwise) direction. As part of the classification process (at 1206), the computer 100, in some implementations, considers whether the two predictions for each particular contour point match each other or not. In an exemplary implementation, if the computer 100 determines that the two predictions match each (e.g., both predictions classified a particular contour point as a "corner region" point, or both predictions classified the particular contour point as a "curve region" point), then the computer 100 confirms the matching prediction is an appropriate classification for that point. However, if the computer 100 determines that the two predictions do not match each (e.g., one of the predictions classified the contour point as a "corner region" point, but the other prediction classified the contour point as a "curve region" point), then the computer 100, in an exemplary implementation, chooses one of those predictions as the appropriate classification for that point. There are a variety of ways in which the computer 100 may choose a particular one of conflicting predictions. In an exemplary implementation, the computer 100 will have a default approach of always classifying any contour point that has conflicting LSTM predictions as either a "curve region" point or, alternatively, as a "corner region" point. Indeed, in some implementations, the computer 100 has a default approach of always classifying any contour point that has conflicting LSTM predictions as a "corner region" point.

At the conclusion of this classification process (1206), the computer 100 will have classified each contour point in the contour as either a "curve region" point or, alternatively, as a "corner region" point. In most cases, the contour will have been thereby effectively segmented into curve regions and corner regions. Each curve region at this point in the process may include one or more contour points that have been classified as "curve region" contour points. Each corner region at this point in the process may include one or more "corner region" contour points.

Next, in the illustrated flowchart, the computer 100 performs post-processing to minimize the risk of false positives and/or false negatives.

According to the illustrated implementation, the post-processing includes removing small corner regions (at 1208*a*) as well as small curve regions (at 1208*b*).

More specifically, according to the illustrated implementation, the computer 100 (at 1208*a*) removes any corner regions having fewer than a threshold number (e.g., three) of consecutive contour points. In some implementations, in this regard, the computer 100 may review the assigned classifications for each contour point around a particular contour in order and, if the computer 100 finds any segment on the contour that has fewer than three consecutive corner region contour points, for example, surrounded by curve region contour points on both sides thereof, then the computer 100 causes those corner region contour points to be reclassified as curve region contour points.

Likewise, in the illustrated implementation, the computer 100 (at 1208*b*) removes any curve regions having fewer than a threshold number (e.g., six) of consecutive contour points. Six or fewer consecutive contour points is generally not enough contour points to provide a good fitting geometric curve. In some implementations, for example, if the computer 100, in its review of the assigned classifications for each contour point around a particular contour in order, finds any segment on the contour with fewer than six consecutive curve region contour points surrounded by corner region contour points on both sides thereof, then the computer 100 causes those curve region contour points to be reclassified as corner region contour points.

These post-processing functions to correct false positives and false negatives (at 1208) may reduce the number of curve regions and corner regions on a contour.

Note that the specific numbers used to determine if the curve region is small (six) and if the corner region is small (three) are just examples. Depending upon the size or resolution of the image or the complexity of the image these numbers can be increased or decreased to suit the application.

Figure 15:
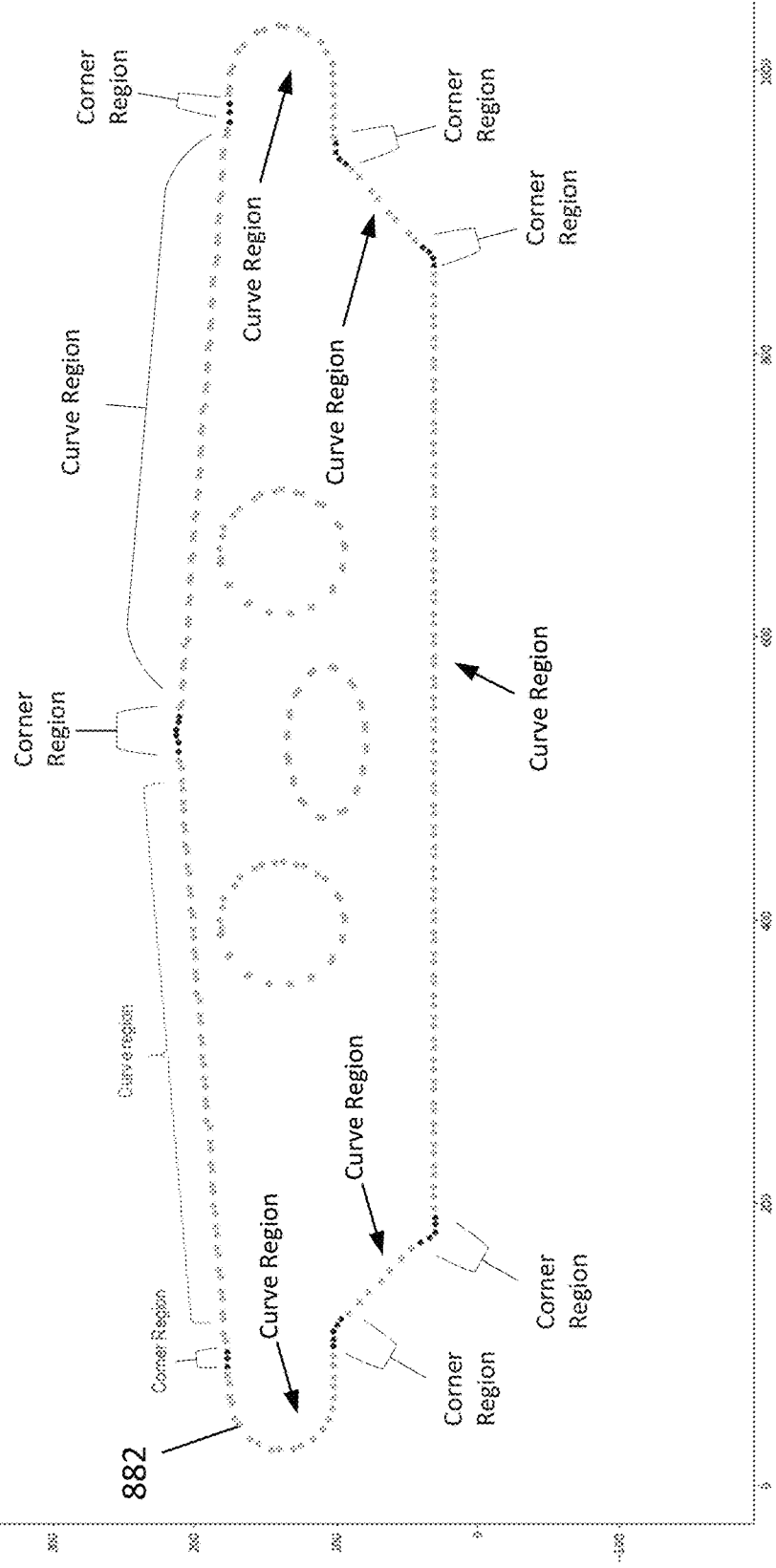
FIG. 15 shows an example of contour points having been classified as either "curve region" contour points or "corner region" contour points.

After the classifying step (at 456 in FIG. 4), all the contour points (e.g., on contour 882) will have been classified as either "curve region" contour points or "corner region" contour points. An example of this is shown in FIG. 15, which shows the various contour points around contour 882 and identifies each point's classification. As shown, the illustrated contour 882 has seven corner regions (made up of points that have been classified, e.g., by contour point classifier 224 and computer 100 as "corner region" points), and seven curve regions (made up of points that have been classified, e.g., by contour point classifier 224 and computer 100 as "curve region" points). The corner regions and curve regions in the illustrated contour 882 are labeled as such in the figure. As illustrated, each curve region is separated from its adjacent curve regions by one corner region, and each corner region is separated from its adjacent corner region by one curve region. Of note in the illustrated example, none of the corner regions has fewer than three "corner region" contour points and none of the curve regions has fewer than six "curve region" contour points.

Referring again to FIG. 4, after classifying the contour points into "curve region" points or "corner region" points, the computer 100 (at 458) creates fillets in corner regions, where applicable. More specifically, in some implementations, the computer's fillet creator 226 (at 458) creates fillets in corner regions, where applicable.

Figure 16:
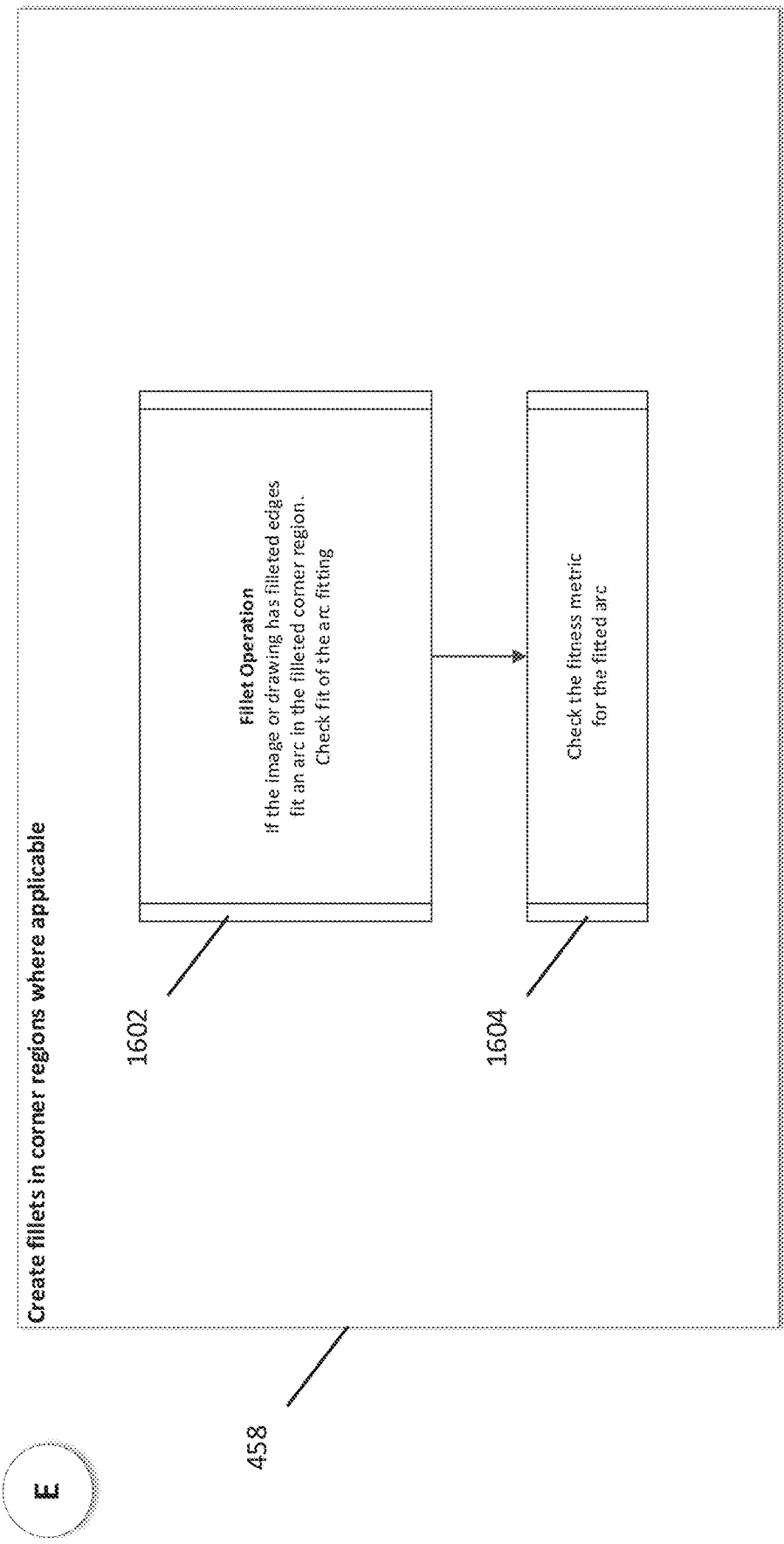
FIG. 16 is a flowchart showing steps involved in an exemplary implementation of the fillet creation process.

FIG. 16 is a flowchart showing steps involved in an exemplary implementation of the fillet creation process (458). In some implementations, the computer 100 determines whether the image or contour(s) has any filleted edges. If the computer 100 determines that the image or contour(s) has any filleted edges, then, according to the illustrated flowchart, the computer 100 (or, more specifically, the computer's fillet creator 226) fits an arc in the filleted corner region (at 1602) and checks the fitness metric, discussed below, for the fitted arc (at 1604). If the fitness metric satisfies a predefined threshold for acceptability (which may be stored in memory 104, for example), the fitted arc is accepted. Otherwise, if the fitness metric does not satisfy the predefined threshold for acceptability, then the computer 100 may, for example, modify the arc or replace it with another, potentially better suited arc (returning to 1602 to do so).

Referring again to FIG. 4, after creating any fillets in the corner regions where applicable (at 458), the computer 100 next (at 460) finds "best-fit" curves (e.g., lines, arcs or splines) for the contour points in each curve region. More specifically, in some implementations, the computer's "best fit" curve finder 228 performs these functionalities.

Figure 17:
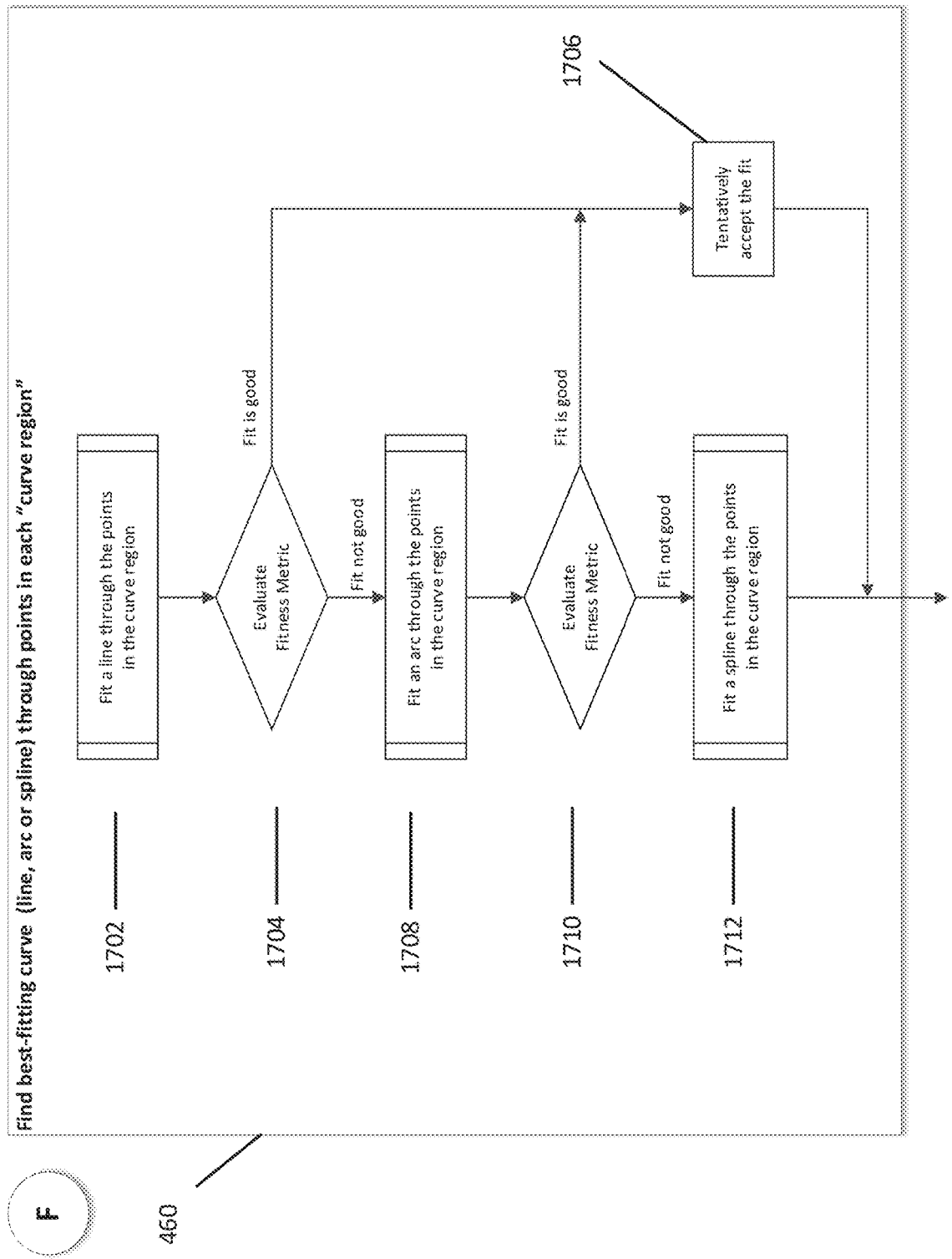
FIG. 17 is a flowchart showing steps involved in an exemplary implementation of the "best fit" curve finding process for a particular curve region in a contour.

FIG. 17 is a flowchart showing steps involved in an exemplary implementation of the "best fit" curve finding process (460) for a particular curve region in a contour.

In some implementations, the process (460) represented in the illustrated flowchart would be repeated for each curve region in the contour. At the end of this process (460) a "best fit" curve will have been identified for each curve region. Each "best fit" curve would be represented by an equation, derived by the computer 100, and stored (e.g., in memory 104).

According to the illustrated implementation, first, the computer 100 (at 1702) fits a line through the contour points of the curve region. The computer 100 in this regard may perform any one or more of a variety of different curve fitting techniques to fit the line through the contour points of the curve region. Curve fitting refers generally to the process of constructing a curve (e.g., a line, arc, spline, etc.) or mathematical function that represents the curve, that has the best fit to a series of data points possibly subject to constraints. In various implementations, curve fitting may include interpolation, smoothing, etc.

The computer 100 then (at 1704) evaluates a fitness metric for the fitted line. More specifically, in some implementations, the computer's fitness evaluator 230 evaluates the fitness metric.

If the computer 100 (at 1704) determines that the fit is good (i.e., the fitness metric for the fitted line satisfies a predefined threshold for acceptability, which may be stored in memory 104, for example), then the computer 100 tentatively accepts the fitted line. If the computer 100 (at 1704) determines that the fit is not good (i.e., the fitness metric for the fitted line does not satisfy the predefined criteria for acceptability), then the computer 100 rejects the fitted line and proceeds to fit (with one or more curve fitting techniques) an arc through the points in the curve region (at 1708).

After the computer 100 has fit an arc through the points in the curve region (at 1708), the computer 100 (at 1710) evaluates a fitness metric for the fitted arc. More specifically, in some implementations, the computer's fitness evaluator 230 evaluates the fitness metric.

If the computer 100 (at 1710) determines that the fit is good (i.e., the fitness metric for the fitted arc satisfies a predefined threshold for acceptability, which may be stored in memory 104, for example), then the computer 100 tentatively accepts the fitted arc. If the computer 100 (at 1710) determines that the fit is not good (i.e., the fitness metric for the fitted arc does not satisfy the predefined criteria for acceptability), then the computer 100 rejects the fitted arc and proceeds to fit (with one or more curve fitting techniques) a spline through the points in the curve region (at 1712).

There are a variety of ways in which the computer could (at 1604, 1704, and/or 1710) compute and evaluate a fitness metric during curve fitting. FIG. 18 (top half) shows an example of a fitness metric that can be computed by the computer 100 for use during curve fitting (e.g., at 1604, 1704, and/or 1710). In the illustrated example, the fitness metric essentially measures the average deviation per point from the fitted curve. In some implementations, this computation and/or subsequent evaluation are performed by the computer's fitness evaluator 230.

Figure 24:
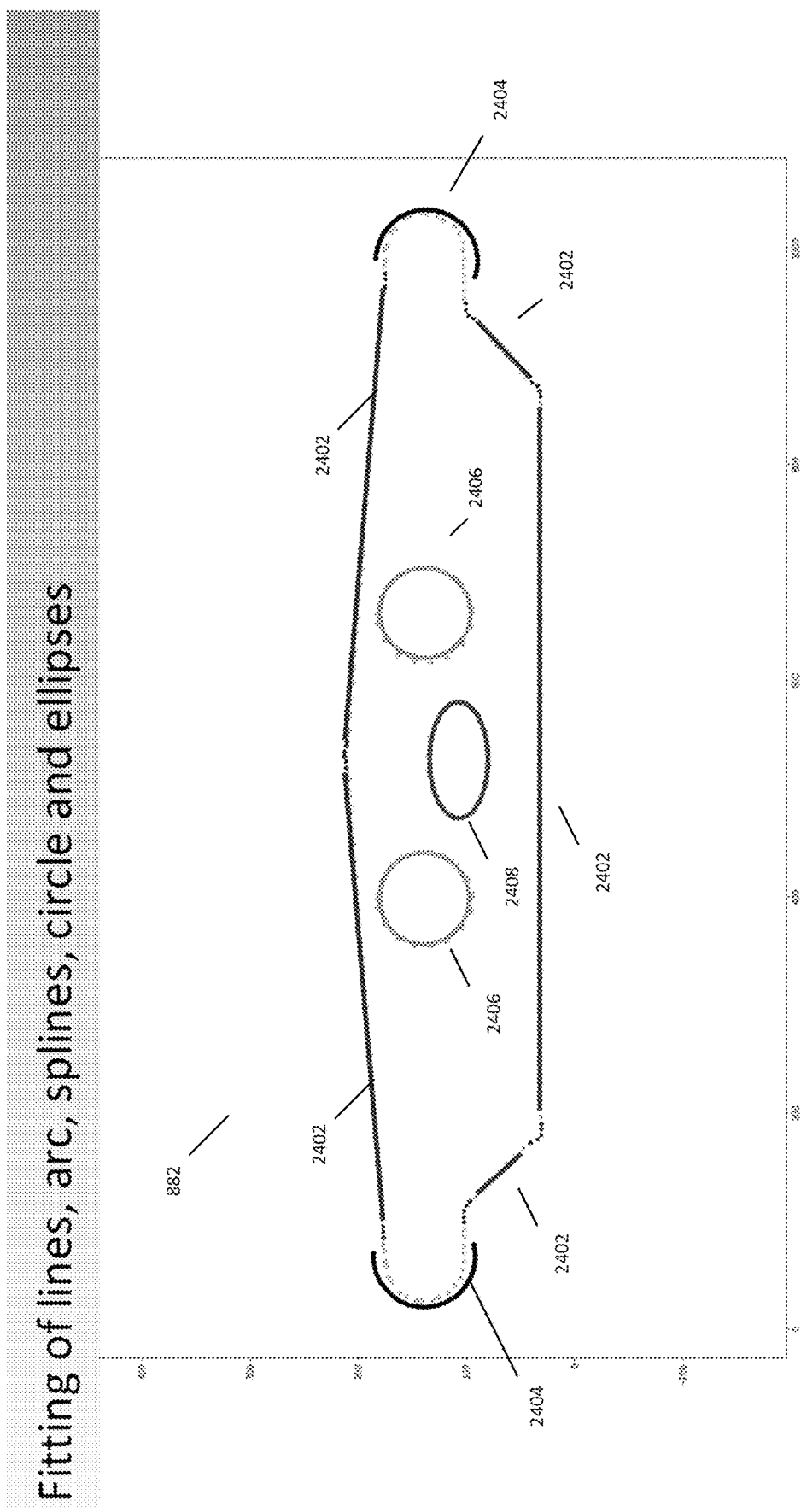
FIG. 24 shows an example of curves (e.g., lines, arcs, splines, circles, and ellipses) having been applied to the curve regions of the contour on an image coordinate system.

FIG. 24 shows an example of curves (e.g., lines, arcs, splines, circles and ellipses) having been applied to the curve regions of the contour 882 on an image coordinate system. More specifically, the curves in the illustrated example include lines 2402, arcs 2404, circles 2406 and ellipses 2408. Each respective curve in the illustrated example is optimally fitted through a sequence of contour points that would have been classified previously as "curve region" contour points, using the LSTM. There are no curves or other graphical elements in the illustrated that correspond to the "corner region" contour points. Therefore, in the illustrated example, only the "corner region" contour points themselves are visible in the corner regions of the contour 882. In some implementations, the computer 100 may be configured to present an image of the FIG. 24 likeness at the computer's display.

Referring again to FIG. 4, after the computer 100 finds a "best fit" curve for each curve region (at 460), the computer 100 (at 462) then evaluates a fitness metric (to determine whether any refinements might be needed or desirable) for the contour or an entire image. FIG. 18 (bottom half) shows an example of a fitness metric that can be computed by the computer 100 (at 462) and used to consider advisability of refinement. The fitness metric represented in the bottom half of the figure essentially measures the maximum deviation of any contour point from the corresponding point on the curve. The deviation of every point is measured from a specific point. In some implementations, this computation and/or subsequent evaluation are performed by the computer's fitness evaluator 230.

If the computer 100 (at 462) determines that the fit is not good (i.e., the fitness metric does not satisfy the predefined criteria for acceptability), then computer 100 (at 464) applies a refine algorithm to improve the fit. More specifically, in some implementations, the computer's refiner 232 performs these functionalities.

Figure 19:
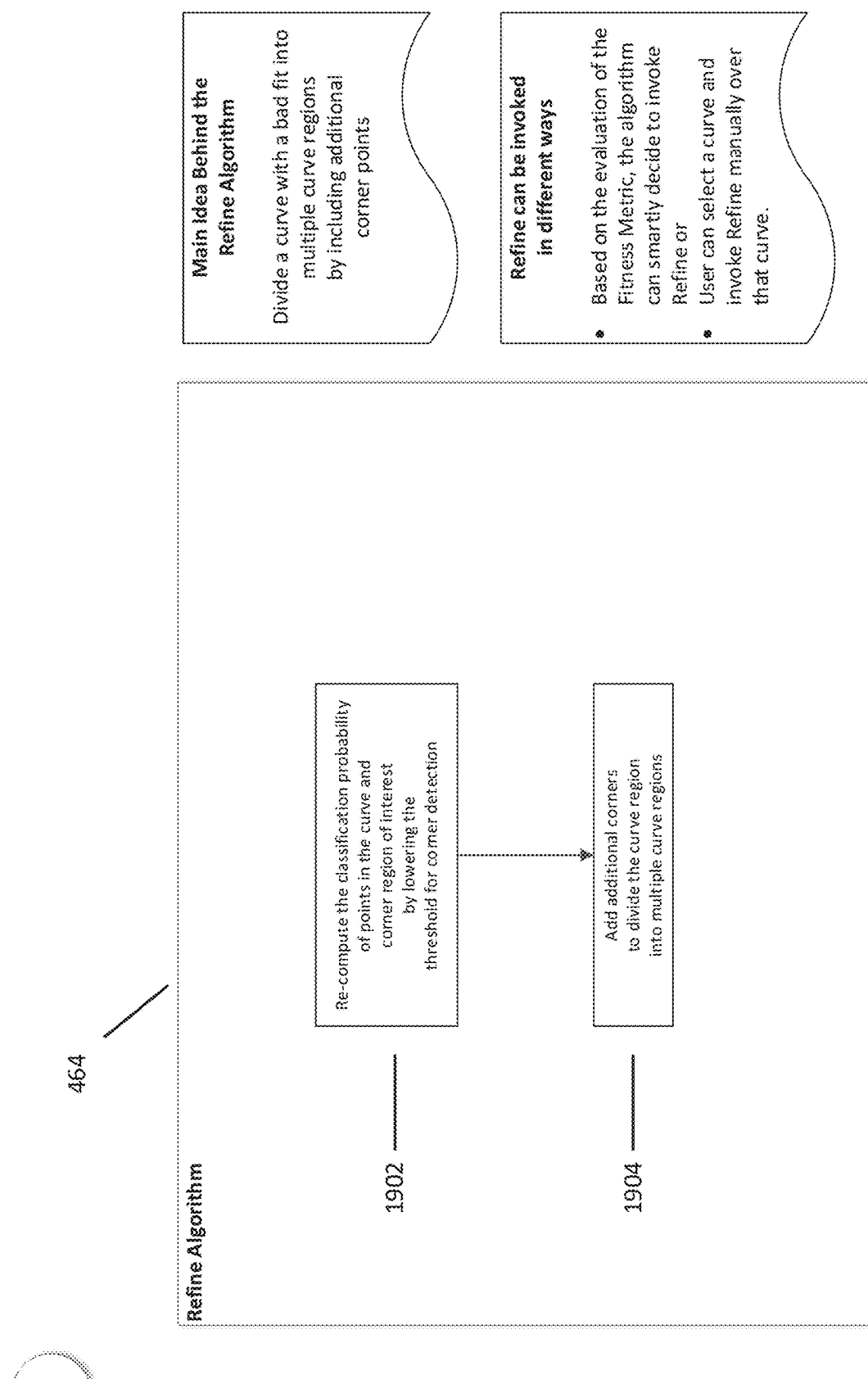
FIG. 19 is a flowchart showing steps involved in an exemplary implementation of the refine algorithm.

FIG. 19 is a flowchart showing steps involved in an exemplary implementation of the refine algorithm (464). The main idea behind the refine algorithm (464), as noted in the figure, is to divide the curve region with the bad fit (as determined at 462) into more than one curve regions by reclassifying some of the contour points previously classified as "curve region" contour points as "corner region" contour points. Thus, in some implementations, the refine algorithm (at 464) results in certain contour points that previously were classified as "curve region" contour points being reclassified as "corner region" contour points. This essentially divides the curve region with the bad fit (as determined at 462) into more than one curve region separated by the reclassified "corner region" contour points.

The refine algorithm (at 464) typically does not result in a change in classification of any contour points previously classified as "corner region" contour points.

As further noted in the figure, in various implementations, the refine algorithm can be invoked either based on the computer's evaluation of the fitness metric (e.g., if the fit is no good at 462) or by a human user selecting a curve to be refined and invoking the refine algorithm to perform refinement on the selected. There are a variety of ways in which the computer 100 might enable a human user to select the curve and invoke the refine algorithm. For example, the computer 100 may enable a human user to select a curve by presenting a visual representation of the image with any applied curves (e.g., as shown in the upper left corner of FIG. 20) on the computer's display screen, where the applied curves are selectable (e.g., by the user positioning a cursor over them and clicking). Additionally, the computer 100 might enable a human user to invoke the refine algorithm by providing a refine button or other user-selectable graphical or textual element on the computer's display screen, the selection of which causes the computer to launch into the refine algorithm (e.g., for a selected curve).

According to the illustrated flowchart, the refine algorithm (at 464) involves the computer 100 (at 1902) lowering the threshold for corner detection and reclassifying the contour points associated with the curve at issue as "curve region" contour points or "corner region" contour points. Lowering the threshold for a contour point to be classified as a "corner region" contour point (e.g., from 80% probability to 70% probability) increases the possibility that any particular contour points in the curve with the bad fit (as determined by 462) will be reclassified as a "corner region" contour point. In some implementations, the refine algorithm 464 may iteratively lower the threshold for corner detection (at 1902) until at least one new "corner region" is identified in the reclassification process.

Next, in the illustrated flowchart, the computer 100 (at 1904) adds additional corner regions to divide the "bad fit" curve region into more than one curve region, based on the outcome of the reclassifications (at 1902). Each of the resulting curve regions would be smaller than the original "bad fit" curve region.

Referring again to FIG. 4, after the refine algorithm (at 464) it divides the curve region with the bad fit into multiple smaller curve regions, the computer 100 returns to 460 to find new "best fit" curves for each of the multiple smaller curve regions.

Figure 25:
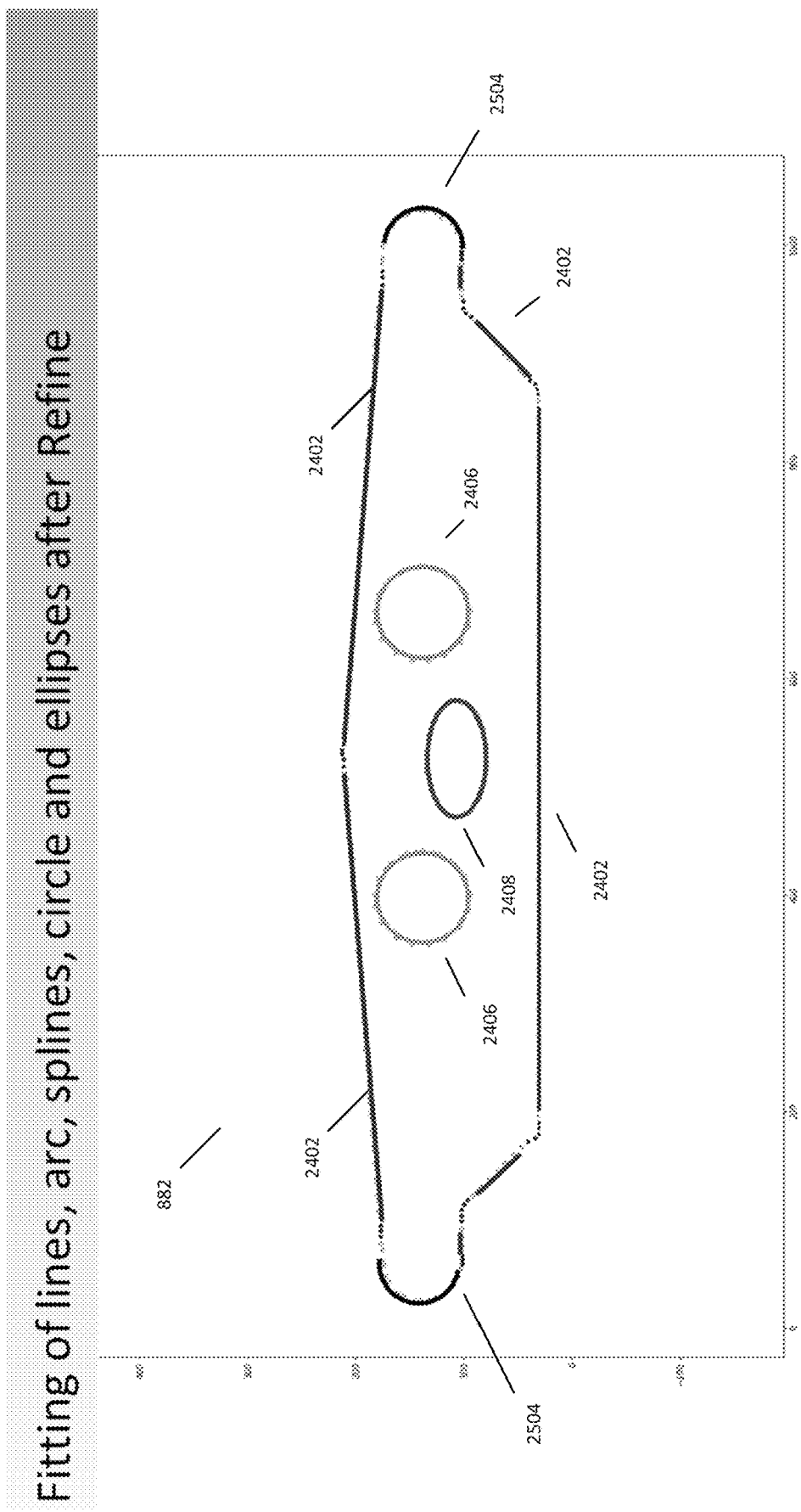
FIG. 25 shows an example of curves (e.g., lines, arcs, splines, circles, and ellipses) having been applied to the curve regions of the contour on an image coordinate system, after a refine process.

FIG. 25 shows an example of curves (e.g., lines, arcs, splines, circles and ellipses) having been applied to the curve regions of the contour 882 on an image coordinate system, after a refine process (at 464). This figure can be compared to the FIG. 24. Some of the curves applied to FIG. 25 (after refinement) are the same as the corresponding curves in FIG. 24 (before refinement). Some of the curves applied in FIG. 25 (after refinement) are different than the corresponding curves in FIG. 24 (before refinement). For example, lines 2402, circles 2406 and ellipses 2408 are the same in FIG. 25 as in FIG. 24. However, arcs 2504 in FIG. 25 are different (better fit) than the corresponding arcs 2404 in FIG. 24.

Each respective curve in FIG. 25 corresponds to a sequence of contour points that would have been classified previously as "curve region" contour points, using the LSTM. There are no curves or other graphical elements in the illustrated that correspond to "corner region" contour points (after refinement). Therefore, in the illustrated example, only the "corner region" contour points themselves are visible in the corner regions of the contour 882. In some implementations, the computer 100 may be configured to present an image of the FIG. 25 likeness at the computer's display.

Figure 20:
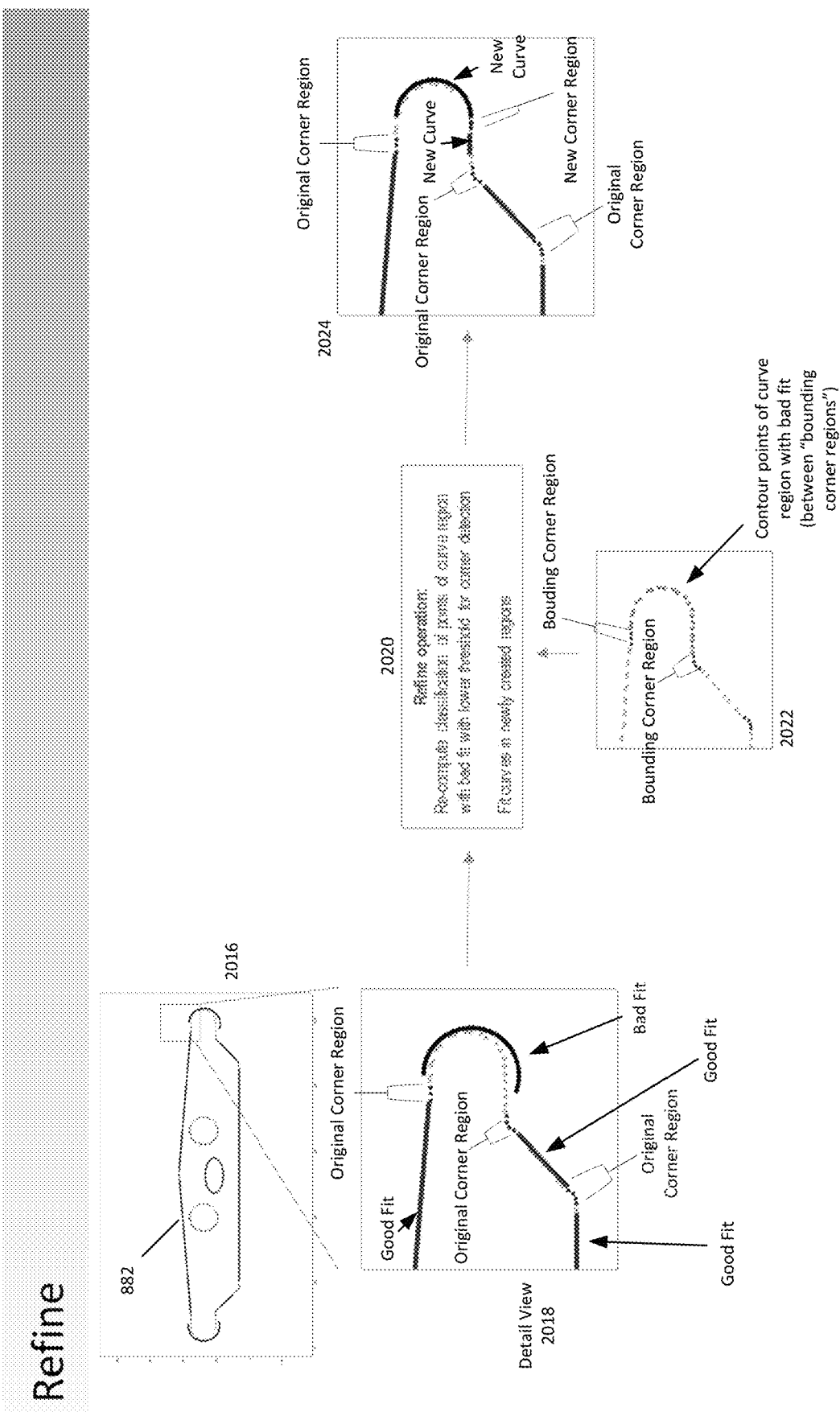
FIG. 20 illustrates an example of a refine algorithm being applied to a curve region that has been determined to have a bad fit.

FIG. 20 illustrates an example of a refine algorithm being applied to a specific curve region that has been determined to have a bad fit (see box 2016 in FIG. 20).

The left side of the figure shows a set of curves that have been applied to each of the curve regions of the contour 882 and also shows the originally-classified corner regions. In the detailed view (2018) original corner regions are labeled as such. Three out of the four curves shown in the detailed view are labeled as "good fits," which means that they were deemed good fits (at 462). One of the four curves in the detailed view (the rightmost arc), however, is labeled a "bad fit," which means that it was deemed a bad fit either by the human user or by the computer 100 (at 462).

As indicated in box 2020, the refine operation (based on 464 and 460) essentially recomputes classification of the contour points of the curve region with the bad fit using a lower threshold for corner detection and fits curves in the newly created regions. Box 2022 shows contour points, including those that correspond to the curve region with the bad fit. The contour points of the curve region with the bad fit act as inputs to the refine operation of box 2020.

Box 2024 shows the results of the refine operation, which include a new corner region, which resulted from the associated contour points being reclassified in the refine operation from "curve region" contour points to "corner region" contour points, and two new curves. Each new curve in the illustrated example extends from one of the original corner regions to the new corner region. Each of these new curves is a better fit than the original "bad fit" curve they replaced.

Thus, in the illustrated example, the refine operation replaced one bad fit curve with a new corner region and two better fit curves.

Referring again to FIG. 4, if the computer 100 (at 462) determines that the fit is good (i.e., the fitness metric satisfies a predefined threshold for acceptability), then the computer 100 proceeds to 466 and finds intersections of adjacent curves using their equations determined during fit (at 460). In some implementations, this function is performed by the computer's intersection finder 234.

Figure 21:
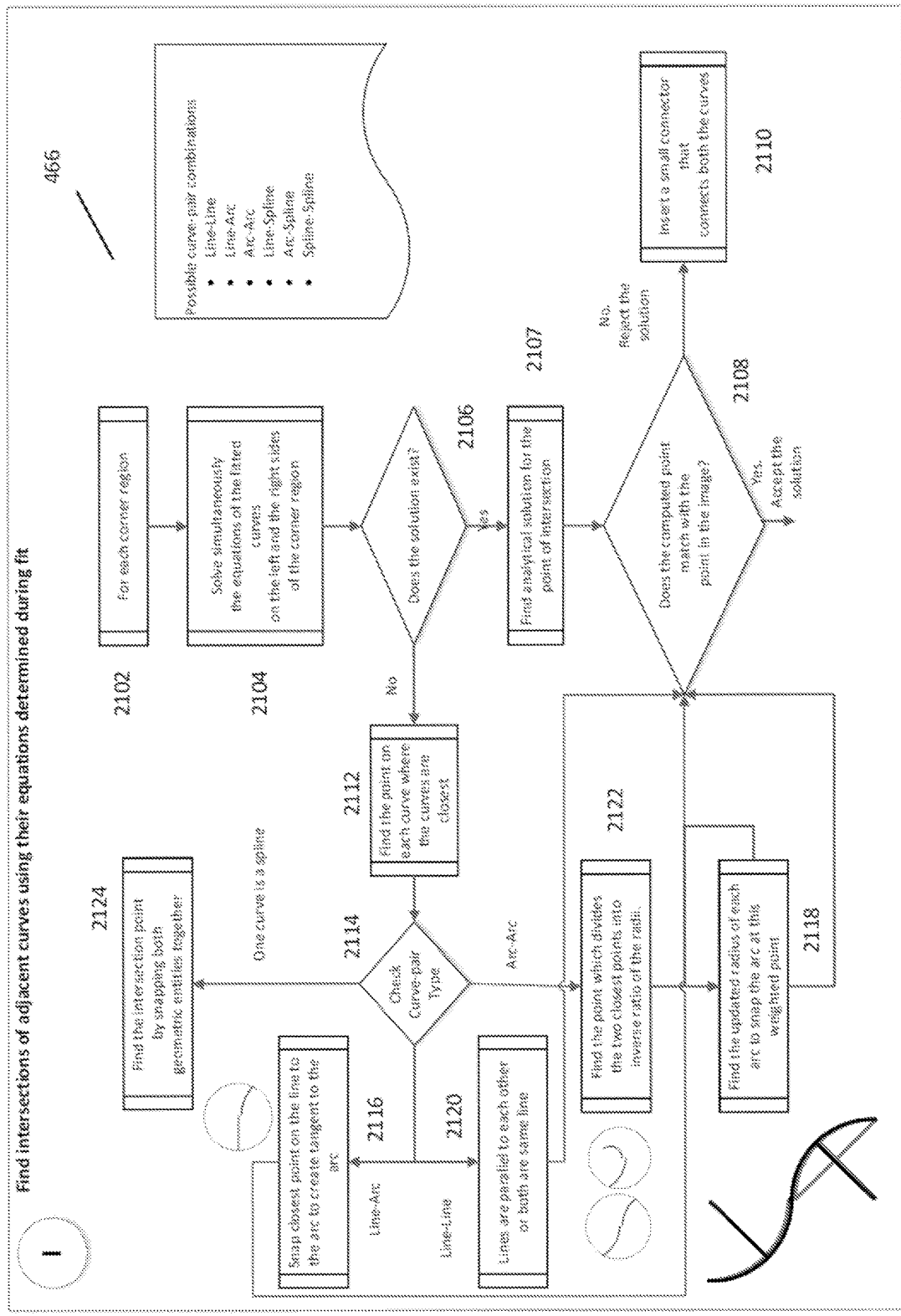
FIG. 21 is a flowchart showing steps involved in an exemplary implementation of finding intersections of adjacent curves using their equations that were determined during fit.

FIG. 21 is a flowchart showing steps involved in an exemplary implementation of the process (466) that the computer 100 implements to find intersections of adjacent curves using their equations that were determined during fit (at 460).

According to the illustrated flowchart, for each corner region (2102), the computer 100 (at 2104) solves the equations for both of the fitted curves on opposite sides of the corner region immediately adjacent to the corner region. The various possible curve pairs (e.g., on two adjacent sides of a particular corner region) are a line and a line, a line and an arc, a line and a spline, an arc and an arc, an arc and a spline, or a spline and a spline.

The computer 100 (at 2106) considers whether a solution exists. For example, when there is no solution possible, for example when two lines are parallel—the system can detect that before solving the equations. The coefficient matrix in this case will be singular i.e., its determinant will be zero or close to zero—that way the system can recognize a solution is not possible. So before trying to solve for a solution it can be important to check if the solution actually exists. A similar situation exists when a line does not actually intersect a circle or an arc—then there is no solution, and this can be detected before trying to solve a solution. If the system tries to solve the equations without checking for this condition, the system will get a numerical error like divide by zero and recovering from such a situation may not be easy.

If the computer 100 (at 2106) determines that a solution exists, then the computer 100 (at 2107) finds an analytical solution for the point of intersection. There are a variety of possible ways that this step may be performed. In one example, the computer 100 uses the equations that represent each curve to calculate points or coordinates, nearest the associated corner region where the two curves intersect.

Next, the computer 100 (at 2108) considers whether the computed point matches a point in the image. There are a variety of ways in which the computer 100 might perform this step. In one example, the computer 100 considers whether the computed point has coordinates (e.g., Cartesian coordinates) that match, for example, the coordinates of one of the "corner region" contour points or the computed point is inside or acceptably close to the bounding box boundary of the corner region. In addition, if the computed point of intersection is determined to be outside of the boundary of the image field, then the computed point of intersection may be considered to be a mismatch.

If the computer 100 (at 2108) determines that the computed point of intersection does not match a point in the image, then the computer 100 rejects the solution. In that case, the computer 100 (at 2110) inserts a small connector that connects the end points of the two curves. The small connector may be, for example, a small line or small arc, and may extend simply between the end points of the two curves along a short path (e.g., the shortest possible path in some instances). This avoids having a point that is way outside the image.

For example, if the two curves at issue are two almost, but not quite parallel, lines then it is possible that their intersection point exists, but that the intersection point is way outside of the image. In that case, the computer 100 (at 2108) might conclude a mismatch and insert a small connector between the closest end points of the lines (at 2110).

If the computer 100 (at 2108) determines that the computed point of intersection does match the corner region in the image, then the computer 100 accepts the solution and proceeds to step 468 (in FIG. 4).

If the computer 100 (at 2106 in FIG. 21) determines that a solution does not exist (e.g., there is no point where the two curves that surround the corner region of interest intersect), then the computer 100 (at 2112) finds the points on each curve where the curves are closest. There are a variety of ways that the computer 100 may perform this function. In some implementations, the computer 100 computes the points on each curve where the curves are closest based on the equations that represent the corresponding curves. More specifically, according to one example, this can be done by orthogonally projecting one of the points onto the other curve. Alternatively, this can also be posed as an optimization problem in which two points, one on each curve, are moved along the curve until the distance between the two curves is minimized using any of the optimization methods that are widely available.

Next, the computer 100 (at 2114) notes the curve pair type. In some implementations, the computer 100 may have this information stored in memory (e.g., in 104) from step 460, where the various curves were created.

If the computer 100 (at 2114) determines that one curve is a line and the other is an arc, for example, then the computer 100 (at 2116) snaps the closest point on the line to make the line tangent to the arc. Here, snapping a point means it is moved to become coincident with another entity. In the case of line-arc intersection, the end point of the line is moved to match with the end point of the arc. The arc is not moved, and neither is the other end of the line. This snapping removes the discontinuity that was there where the two curves came close to each other. This is shown in a circular inset above box 2116. More specifically, the computer 100 moves the line so that its end point, for example, connects to a corresponding point (e.g., end point) on the arc. In many instances, the arc remains unchanged and only the line changes. This is because changing a line tends to be simpler and less resource intensive than changing an arc. However, in some instances (e.g., if moving the line alone is not sufficient), then it is possible that the computer 100 may adjust the arc as well. In those instances, the computer 100 maintains the location of the center point of the arc and adjusts a radius of the arc relative to that center point (e.g., at 2118). In some implementations, these adjustments result in the closest end point of the line touching the closest end point of the arc.

If the computer 100 (at 2114) determines that both curves are lines, then the computer 100 (at 2120) concludes that the lines are parallel to one another or are supposed to be the same line. In some implementations, the computer 100 may simply merge the lines. In some implementations, the computer 100 may distinguish between these two possibilities (e.g., by using the equations for the lines to calculate a distance between them) and then, if the calculated distance is within some threshold value (indicating that the two lines should be one line), merge the two lines. Merging can be accomplished in any number of potential ways. In one example, one of the lines is erased and the other is left intact. In another example, both lines are erased, and a new line is created that is parallel to at least one of the erased lines and between the two erased lines.

If the computer 100 (at 2114) determines that both curves are arcs, then the computer 100 (at 2122) finds the point which divides the two closest points into an inverse ratio of the radii. Next, the computer 100 (at 2118) finds an updated radius of each arc at this weighted point. In some implementations, this results in the closest end points of the two arcs touching one another. For example, if the two circles were of equal radius and not touching each other but close, then each circle would be moved towards the other by half the distance that separates them. But if the two radii are different, one is large and one is small, then because the system is splitting the distance that separates them in the inverse ratio of the radii, the larger circle has to move less because it has a larger radius and the smaller circle has to move more because it has a smaller radius (inverse relationship). This minimizes the disruption caused to the overall image due to this movement—larger entities are moved less and smaller entities are moved more.

If the computer 100 (at 2114) determines that either of the curves in the curve-pair is a spline, then the computer 100 (at 2116) snaps both geometric entities (splines) together. In some implementations, this results in the closest end points of the two splines touching one another.

After making any adjustments to the curve-pairs (after checking them at 2114), the computer 100 proceeds to 2108, discussed above, to consider whether the computed point matches a point in the image. The process continues, as discussed above, from there.

Figure 26:
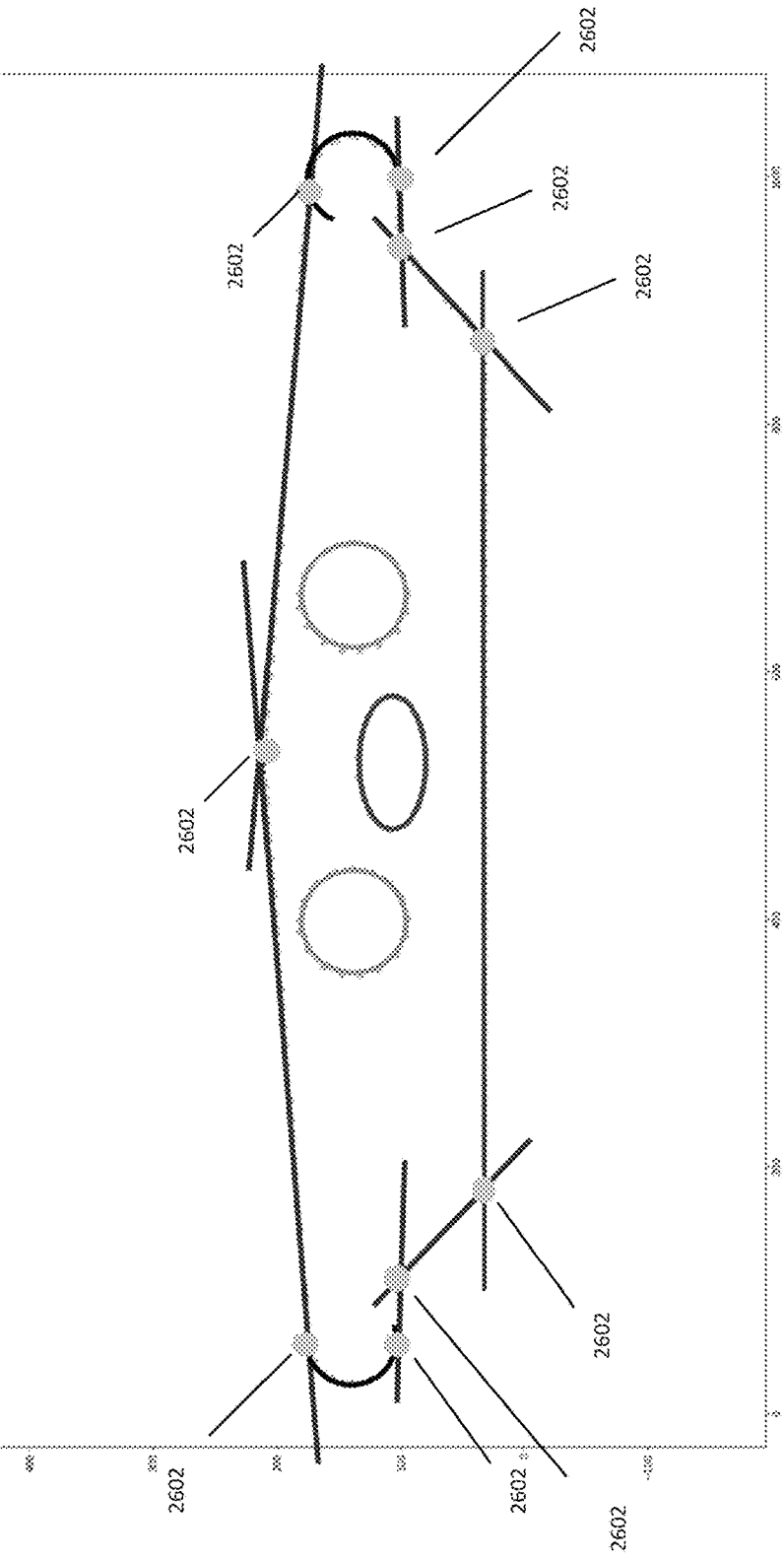
FIG. 26 shows an example of intersection points having been identified on the contour of FIG. 25.

FIG. 26 shows an example of intersection points 2602 having been identified on the contour 882 of FIG. 25. The illustrated example has nine corner regions and nine intersection points 2602.

Referring again to FIG. 4, after connecting adjacent curves (at 466), the computer 100 (at 468) imports the curves (including any connectors) into a CAD environment as sketch entities. In some implementations, the computer's curve importer 236 performs these functionalities.

Figure 22:
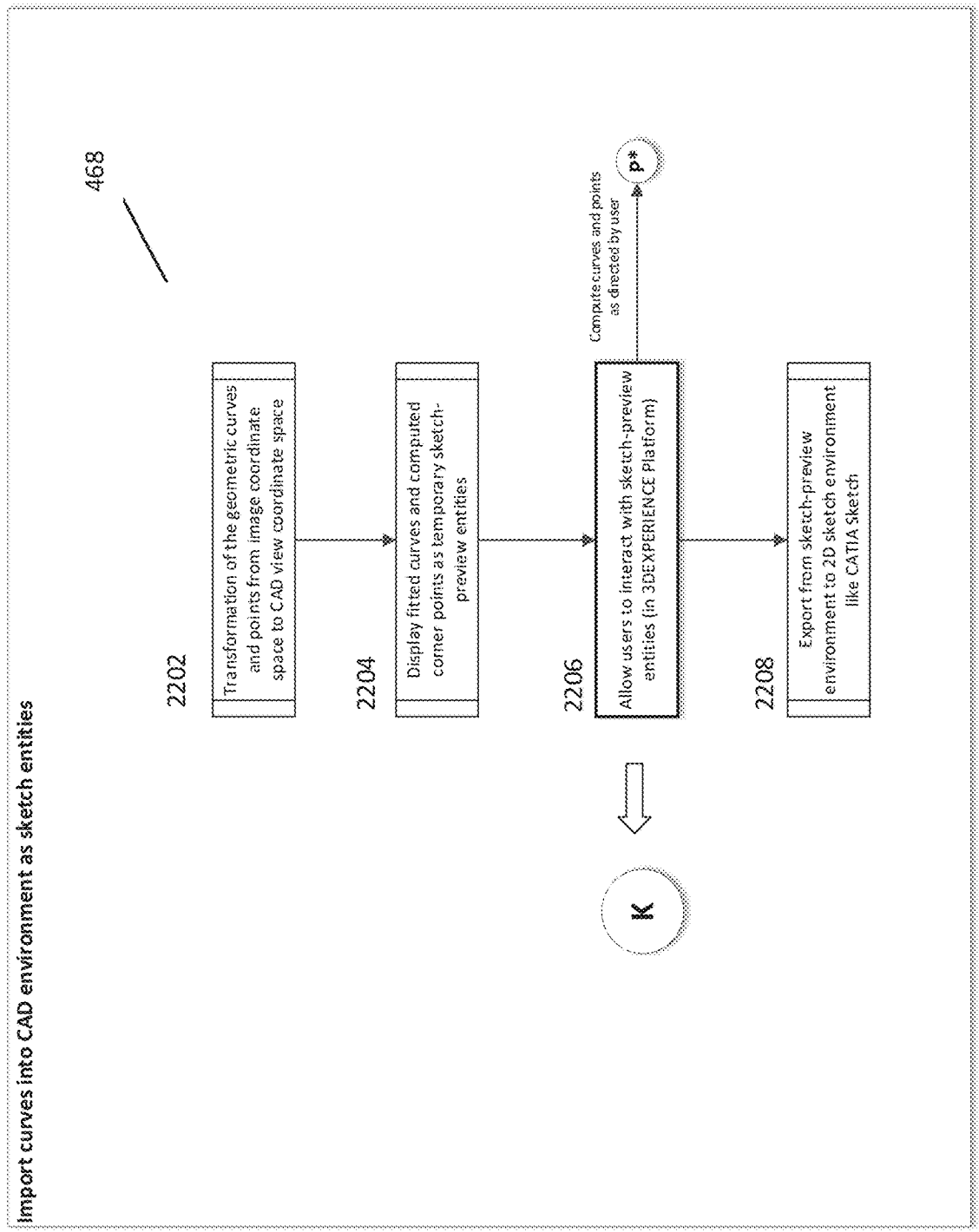
FIG. 22 is a flowchart showing steps involved in an exemplary implementation of the computer importing the curves into the CAD environment as sketch entities

FIG. 22 is a flowchart showing steps involved in an exemplary implementation of the computer 100 importing the curves into the CAD environment as sketch entities (468).

First, according to the illustrated flowchart, the computer 100 transforms the geometric curves and points from image coordinate space to CAD view coordinate space. In general, this may involve translation of the points in the image from the image coordinate space to the CAD view coordinate space followed by an appropriate rotation so that the two coordinate systems align in such a way as to provide the correct view of the converted image in the CAD view coordinate space. A coordinate space is a system of axes or planes used to assign Cartesian coordinates, for example, to curves, images, sketches, features, parts, assemblies, etc. The phrase "image coordinate space" refers to the coordinate space where the image exists. The phrase "CAD view coordinate space" refers to the coordinate space where a sketch that includes the curves and any connectors for the image exists or will exist.

Next, in the illustrated implementation, the computer 100 (at 2204) displays (e.g., on the computer's display) the fitted curves and any shapes (e.g., circles, ellipses, etc.) and any computed corner points and connectors as temporary sketch-preview entities. These are marked as temporary because they can be previewed and modified by the user before they are converted into final sketch entities for downstream modeling operations. These temporary sketch-preview entities are displayed in the CAD view coordinate space.

Next, in the illustrated implementation, the computer 100 (at 2206) enables a human user to interact with the sketch-preview entities. There are a variety of ways in which the computer 100 might provide the human user with access to these types of functionalities. For example, in some implementations, the computer 100 may include a sketcher tool, such as the one included with the computer-based 3DEXPERIENCE@ platform.

Figure 23:
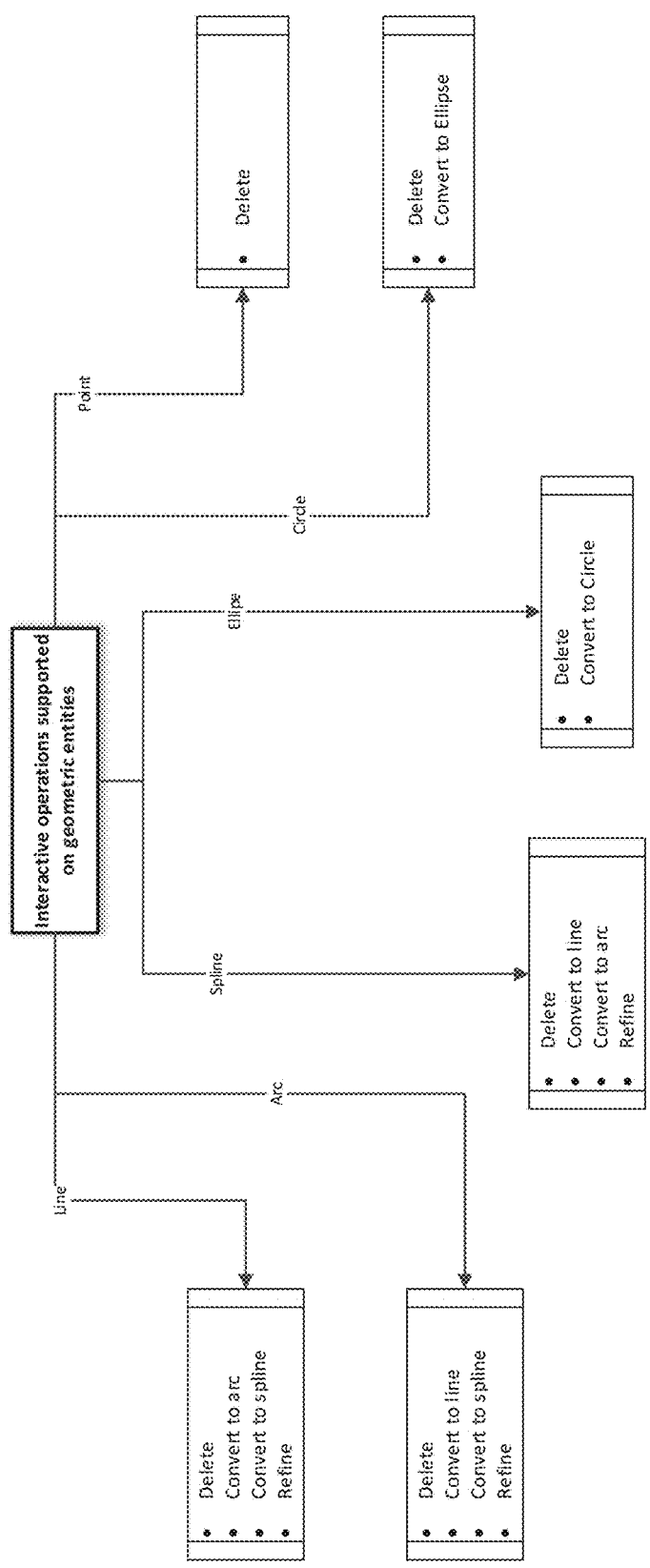
FIG. 23 shows a variety of ways in which a user can interact with a sketch-preview entity to change a sketch.

FIG. 23, for example, shows the variety of ways in which a user can interact with a sketch-preview entity on the 3DEXPERIENCE@ platform to change a sketch. The interactive operations supported on geometric entities represented in the illustrated figure depend on the type of geometric entity at issue. For lines, the interactive operations include delete, convert to arc, convert to spline, and refine. For arcs, the interactive operations include delete, convert to line, convert to spline, and refine. For splines, the interactive operations include delete, convert to line, convert to arc, and refine. For an ellipse, the interactive operations include delete, and convert to circle. For a circle, the interactive operations include delete, and convert to ellipse. For a point, the interactive operation includes delete. Variations are possible.

In an exemplary implementation, the user interface (UI) allows the human CAD user to choose a curve different from what the algorithm has determined. The user can also, in some implementations, add or remove corner points if desired in order to alter the fit. The UI also sometimes allows the user to perform multiple iterations of the intelligent "refine" algorithm to improve the fit in only certain regions of the image. Other variations are possible as well.

If the user (at 2206) takes advantage of the interactive operations made available to him or her (at 2206) to make any modifications, the computer 100 subsequently returns (via P*) to step 466 in FIG. 4 to reassess those user-modified curves, etc.

Figure 27:
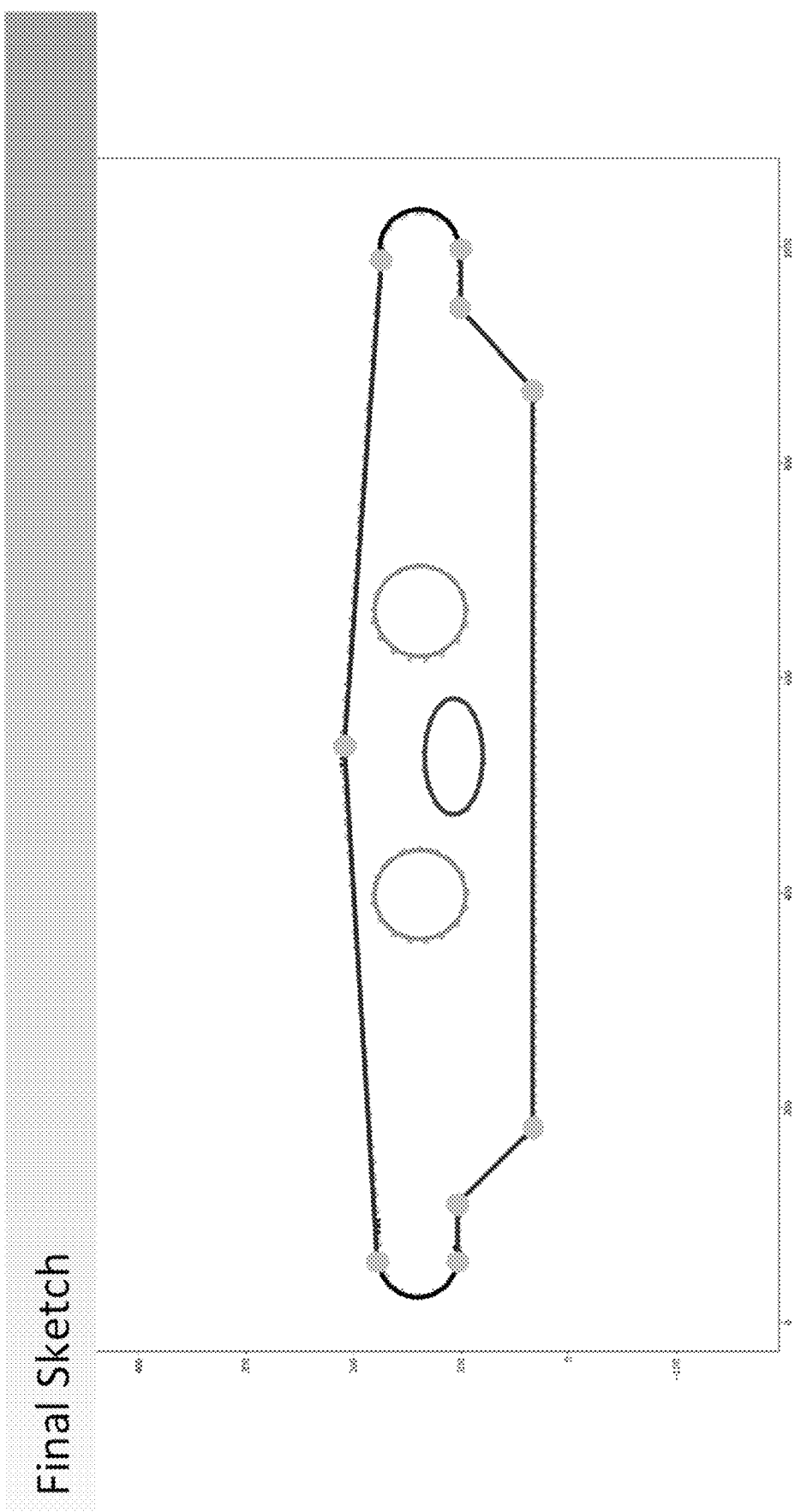
FIG. 27 shows an example of a final sketch converted from an image.

FIG. 27 shows an example of a final sketch that may appear, for example, in a CAD environment and be modified by a human user in the CAD environment and/or used as a basis to create a feature in CAD, etc. The final sketch is a sketch of the originally imported image and contours 802.

A number of embodiments of the invention have been described. Nevertheless, it will be understood that various modifications may be made without departing from the spirit and scope of the invention.

For example, the system may be set up to utilize any number of descriptors and/or other types of descriptors. Instead of angles being used as descriptors, for example, the descriptors could be slope(s) of lines between point of consideration and neighboring points (e.g., on both sides of the point of consideration, N steps away). Also, in some implementations, distance between such points make be taken into consideration. Other possibilities exist as well.

There are a variety of analytical approaches that the computer can implement to identify or compute a "best fit" curve for a particular segment of contour points. In one example, the computer utilizes regression analysis (e.g., linear regression).

The systems and techniques disclosed herein may be applied to product design using CAD software specifically in the area of mechanical design. Another area where this might be useful is video game design by generating the contours of real-world objects for use in a gaming environment. The systems and techniques may be extrapolated to other uses in CAD such as generating multiple discrete sketches of an image based on user input and from those sketches generate 3D geometry to closely replicate an item of interest in the image.

Gaussian smoothing is mentioned herein and may be applied at different points in the processing described herein.

For two-dimensional image data, Gaussian smoothing may be applied before the image is sent to OpenCV for finding contours. In this case, the smoothing helps in removing noise from the image. This process may involve convolving a two-dimensional kernel over the image. A specific example may involve using a 5 pixel×5 pixel kernel, but this could be of any size. The process may use the standard API from OpenCV GaussianBlur( ). Documentation about the API can be found on the OpenCV website at https://docs.opencv.org/4.x/d4/d86/group_imgproc_filter.html #gaabe8c836e97159a9193fb0b11ac52cf1.

For one-dimensional data of sequence of points, Gaussian smoothing may be applied after obtaining contour points from OpenCV. This is a sequence of contour points, with each point identified by its (x, y) coordinates. Applying Gaussian smoothing helps in removing noise from contour point locations. The process involves applying the one-dimensional kernel ([1, 4, 6, 4, 1]) to get the weighted average for each point using OpenCV. This is like creating a moving average of (x, y) coordinates of contour points but the weights (one-dimensional kernel) used are obtained from probability mass function of a binomial distribution.

Finding contours is mentioned herein. To find contours from an image, the system may use, for example, the OpenCV API function findContours(). More information about this function can be found at the OpenCV website at:
    https://docs.opencv.org/3.4.17/d3/dco/ group_imgproc_shapehtml      #ga17ed9f5d79ae97 bd4c7cf18403e1689a.

For mode, the system may use cv.RETR_TREE. This retrieves all of the contours and reconstructs a full hierarchy of nested contours. More information about contour computation can be found on the OpenCV website at:
    https://docs.opencv.org/4x/d9/d8b/tutorial py contours hierarchy.html/.

For method, the system may use, for example, cv.CHAIN_APPROX_NONE. This parameter specifies the contour approximation method. The values specified for this parameter tells OpenCV to store absolutely all the contour points.

In certain implementations, the computer-implemented method disclosed herein includes computing (e.g., with a computer-implemented intersection finder a point of intersection between the fitted curves for adjacent curve regions using equations, stored in computer memory, that represent each of the fitted curves for the adjacent curve regions. (See e.g., FIG. 4 and FIG. 21). If the computed point of intersection lies inside or is acceptably close to (e.g., within some threshold distance from) a corresponding corner region, the method includes connecting the adjacent curve regions to one another with a connector that passes through the identified point of intersection. If the computed point of intersection lies at a position on the image that is not acceptable (e.g., not within some threshold distance from) or lies outside the image, then the method includes inserting a small connector that connects the adjacent curve regions to one another. In an exemplary implementation, the system/method may use a threshold of 10 and 15 pixels as follows: 1) if the computed point is within 10 pixels from a median point of the corner region, then the system accepts that solution; 2) if the computed point is further than 10 pixels from the median point in the corner region, but is within 15 pixels of a contour boundary, then the system accepts that solution; 3) otherwise, the system identifies the computed point as not "acceptably close." The numbers 10 and 15 can vary (e.g., by +/−10%, +/−20%, +/−30%, etc.) in various implementations depending, for example, on the resolution of the associated image.

It should be understood that the example embodiments described herein may be implemented in many different ways. In some instances, the various methods and machines described herein may each be implemented by a physical, virtual, or hybrid general purpose computer, such as a computer system, or a computer network environment, such as those described herein. The computer/system may be transformed into the machines that execute the methods described herein, for example, by loading software instructions into either memory or non-volatile storage for execution by the CPU. One of ordinary skill in the art should understand that the computer/system and its various components may be configured to carry out any embodiments or combination of embodiments of the present invention described herein. Further, the system may implement the various embodiments described herein utilizing any combination of hardware, software, and firmware modules operatively coupled, internally, or externally, to or incorporated into the computer/system.

Various aspects of the subject matter disclosed herein can be implemented in digital electronic circuitry, or in computer-based software, firmware, or hardware, including the structures disclosed in this specification and/or their structural equivalents, and/or in combinations thereof. In some embodiments, the subject matter disclosed herein can be implemented in one or more computer programs, that is, one or more modules of computer program instructions, encoded on computer storage medium for execution by, or to control the operation of, one or more data processing apparatuses (e.g., processors). Alternatively, or additionally, the program instructions can be encoded on an artificially generated propagated signal, for example, a machine-generated electrical, optical, or electromagnetic signal that is generated to encode information for transmission to suitable receiver apparatus for execution by a data processing apparatus. A computer storage medium can be, or can be included within, a computer-readable storage device, a computer-readable storage substrate, a random or serial access memory array or device, or a combination thereof. While a computer storage medium should not be considered to be solely a propagated signal, a computer storage medium may be a source or destination of computer program instructions encoded in an artificially generated propagated signal. The computer storage medium can also be, or be included in, one or more separate physical components or media, for example, multiple CDs, computer disks, and/or other storage devices.

Certain operations described in this specification (e.g., aspects of those represented in FIGS. 4, 6, 7, 9, 12, 16, 17, 19, 21, 22, 23 and otherwise disclosed herein) can be implemented as operations performed by a data processing apparatus (e.g., a processor/specially programmed processor/computer) on data stored on one or more computer-readable storage devices or received from other sources, such as the computer system and/or network environment described herein. The term "processor" (or the like) encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, for example, code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing, and grid computing infrastructures.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations may be described herein as occurring in a particular order or manner, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Other implementations are within the scope of the claims.

What is claimed is:

1. A computer-implemented method of converting a computer representation of an image that is not able to be modified with computer-aided design (CAD) software into a sketch that is able to be modified in the CAD software, the computer-implemented method comprising:
receiving a digital representation of an image that is not able to be modified with computer-aided design (CAD) software;
generating contours, with a computer-implemented contour generator, based on the digital representation of the image, wherein each contour is represented by a sequence of points that follows a path that corresponds to a boundary in the image;
classifying, with a computer-implemented contour point classifier, each contour point in a particular one of the contours as a curve region contour point or a corner region contour point, thereby segmenting the particular contour into a plurality of curve regions separated from one another by corner regions,
wherein the curve regions are made up of curve region contour points only and the corner regions are made up of corner region contour points only; and
fitting a curve to each one of the curve regions with a computer-implemented curve finder to produce a sketch that is able to be modified with the CAD software.

2. The computer-implemented method of claim 1, wherein classifying each point in the contours as a curve region contour point or a corner region contour point comprises:
generating descriptors for each point, wherein the descriptors for each respective point represent a geometry of the contours local to that point.

3. The computer-implemented method of claim 2, wherein generating the descriptors for each respective one of the points comprises:
measuring angles produced at that particular point if lines were drawn from that particular point to, respectively, each one of a consecutive sequence of points starting at N points away from that particular point on both sides of that particular point.

4. The computer-implemented method of claim 2, wherein classifying each point comprises:
classifying a particular one of the points by inputting the descriptors for that particular one of the points into a long short term memory ("LSTM") network that has been trained to perform point classification based on input descriptors.

5. The computer-implemented method of claim 4, wherein classifying each point comprises:
inputting the descriptors for the contour points to the LSTM network one at a time, sequentially, in a first direction, then,
inputting the descriptors for the contour points to the LSTM network one at a time, sequentially, in a second direction that is opposite the first direction.

6. The computer-implemented method of claim 1, further comprising:
evaluating, with a computer-implemented fitness evaluator, a curve fitting fitness metric for each respective one of the fitted curves.

7. The computer-implemented method of claim 6, further comprising:
applying a refine algorithm, with a computer-implemented refiner, to adjust a particular one of the fitted curves if the fitness metric for that fitted curve does not satisfy a predefined criteria for acceptability.

8. The computer-implemented method of claim 7, wherein applying the refine algorithm comprises:
lowering a threshold for corner detection;
reclassifying, with the computer-implemented contour point classifier, each point in the contours as a curve region contour point or a corner region contour point using the lowered threshold for corner detection, thereby segmenting the contours into new curve regions and new corner regions.

9. The computer-implemented method of claim 8, wherein reclassifying each point using the lowered threshold for corner detection results in classifying more of the points as corner region points than the prior classification of points.

10. The computer-implemented method of claim 8, further comprising:
fitting a curve to each one of the new curve regions with the computer-implemented curve finder.

11. The computer-implemented method of claim 1, further comprising:
computing, with a computer-implemented intersection finder, a point of intersection between the fitted curves for adjacent curve regions using equations, stored in computer memory, that represent each of the fitted curves for the adjacent curve regions.

12. The computer-implemented method of claim 11, further comprising:
if the computed point of intersection lies inside or is acceptably close to a corresponding corner region, connecting the adjacent curve regions to one another with a connector that passes through the identified point of intersection.

13. The computer-implemented method of claim 11, wherein if the computed point of intersection lies at a position on the image that is not acceptable or lies outside the image, the method comprises:
inserting a small connector that connects the adjacent curve regions to one another.

14. The computer-implemented method of claim 11, further comprising:
importing the fitted curves, as well as any circles or ellipses or connectors, into a computer-aided design program with a computer-implemented curve importer.

15. The computer-implemented method of claim 1, wherein if the computer-implemented intersection finder determines that a point of intersection between the fitted curves for adjacent curve regions cannot be computed, the method comprises:
finding a point on each of the fitted curves where the fitted curves are closest, and
if one of the fitted curves is a spline, snapping the fitted curves together,
if one of the fitted curves is a line and the other of the fitted curves is an arc, snapping the closest point on the line to the arc,
if both of the fitted curves are lines, then determining whether the fitted curves represent parallel lines or represent only one line, and
if both of the fitted curves are arcs, update a radius for each arc to snap the arcs together.

16. The computer-implemented method of claim 1, further comprising:
after generating the contours based on the digital representation of the image, but classifying each point in one or more of the contours:
checking the image for circles or ellipses and fitting a circle or ellipse to any of the circle or ellipses in the image with a computer-implemented circle fitter.

17. The computer-implemented method of claim 1, further comprising:
creating a fillet in a particular one of the corner regions with a computer-implemented fillet creator.

18. The computer-implemented method of claim 1, wherein the image that is not able to be modified with the CAD software exists as a computer image having a file format selected from the group consisting of an image file, a DXF file, a DWG file, a pdf file, and a point cloud.

19. The computer-implemented method of claim 1, wherein the image that is not able to be modified with computer-aided design (CAD) software is a digital image that represents a scanned version of a real-world mechanical drawing, a scanner version of a real-world hand drawing, or a scanned version of a photograph, or
wherein the image is a digital image captured by a camera.

20. The computer-implemented method of claim 1, further comprising:
displaying the sketch that is able to be modified with the CAD software on a display screen of a computer to enable editing of the sketch using the CAD software;
receiving user instructions through an interface of the CAD software to edit the sketch.

21. A computer system comprising:
a computer processor; and
computer-based memory operatively coupled to the computer processor, wherein the computer-based memory stores computer-readable instructions that, when executed by the computer processor, cause the computer-based system to:
receive a digital representation of an image that is not able to be modified with computer-aided design (CAD) software;
generate contours based on the digital representation of the image, wherein each contour is represented by a sequence of points that follows a path that corresponds to a boundary in the image;
classify each contour point in a particular one of the contours as a curve region contour point or a corner region contour point, thereby segmenting the particular contour into a plurality of curve regions separated from one another by corner regions, wherein the curve regions are made up of curve region contour points only and the corner regions are made up of corner region contour points only; and fit a curve to each one of the curve regions with a computer-implemented curve finder to produce a sketch that is able to be modified with the CAD software.

22. A non-transitory computer readable medium having stored thereon computer-readable instructions that, when executed by a computer-based processor, cause the computer-based processor to:

receive a digital representation of an image that is not able to be modified with computer-aided design (CAD) software;

generate contours based on the digital representation of the image, wherein each contour is represented by a sequence of points that follows a path that corresponds to a boundary in the image;

classify each point in a particular one of the contours as a curve region contour point or a corner region contour point, thereby segmenting the particular contour into a plurality of curve regions separated from one another by corner regions, wherein the curve regions are made up of curve region contour points only and the corner regions are made up of corner region contour points only; and fit a curve to each one of the curve regions with a computer-implemented curve finder to produce a sketch that is able to be modified with the CAD software.

23. A computer-implemented method comprising:

generating a contour, with a computer-implemented contour generator, based on a digital representation of an image, wherein each contour includes a sequence of points that follows a path that corresponds to a boundary in the image;

classifying, with a computer-implemented contour point classifier, each point in the contour as a curve region contour point or a corner region contour point, thereby segmenting the contour into a plurality of curve regions separated from one another by corner regions, wherein the curve regions are made up of curve region contour points only and the corner regions are made up of corner region contour points only;

fitting a curve to each one of the curve regions with a computer-implemented curve finder;

applying a refine algorithm, with a computer-implemented refiner, to adjust the fitted curves in response to a determination that a fitness metric for the fitted curve does not satisfy a predefined criteria for acceptability, wherein applying the refine algorithm comprises:

lowering a threshold for corner detection; and reclassifying, with the computer-implemented contour point classifier, each point in the contour as a curve region contour point or a corner region contour point using the lowered threshold for corner detection, thereby segmenting the contour into new curve regions and new corner regions.

24. The computer-implemented method of claim 23, further comprising:

fitting a curve to each one of the new curve regions with the computer-implemented curve finder.

25. A computer-implemented method comprising:

scanning or photographing a real world version of an image to produce a digital representation of the image that is not able to be modified with computer-aided design (CAD) software;

generating contours, with a computer-implemented contour generator, based on the digital representation of the image, wherein each contour is represented by a sequence of points that follows a path along a boundary in the image;

classifying, with a computer-implemented contour point classifier, each contour point in a particular one of the contours as a curve region contour point or a corner region contour point, thereby segmenting the particular contour into a plurality of curve regions separated from one another by corner regions, wherein the curve regions are made up of curve region contour points only and the corner regions are made up of corner region contour points only; and producing a sketch that can is able to be modified with the CAD software based on the curve region contour points and the corner region contour points, wherein producing the sketch comprises:

fitting a curve to each one of the curve regions with a computer-implemented curve finder.

26. The computer-implemented method of claim 25, further comprising modifying the sketch using the CAD software.

27. The computer-implemented method of claim 25, wherein the image that is not able to be modified with the CAD software exists as a computer image having a file format selected from the group consisting of an image file, a DXF file, a DWG file, a pdf file, and a point cloud.

28. The computer-implemented method of claim 25, wherein the image that is not able to be modified with computer-aided design (CAD) software is a digital image that represents a scanned version of a real-world mechanical drawing, a scanner version of a real-world hand drawing, or a scanned version of a photograph, or wherein the image is a digital image captured by a camera.

29. The computer-implemented method of claim 25, further comprising:

displaying the sketch that is able to be modified with the CAD software on a display screen of a computer to enable editing of the sketch using the CAD software;

receiving user instructions through an interface of the CAD software to edit the sketch.

* * * * *